(12) United States Patent
Lee

(10) Patent No.: US 11,302,626 B2
(45) Date of Patent: Apr. 12, 2022

(54) SEMICONDUCTOR MEMORY DEVICE HAVING CAPACITOR SPACED APART FROM A GATE STACK STRUCTURE

(71) Applicant: SK hynix Inc., Icheon-si (KR)

(72) Inventor: Nam Jae Lee, Cheongju-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/887,867

(22) Filed: May 29, 2020

(65) Prior Publication Data

US 2021/0175167 A1    Jun. 10, 2021

(30) Foreign Application Priority Data

Dec. 6, 2019  (KR) .................. 10-2019-0161860

(51) Int. Cl.
*H01L 23/522*  (2006.01)
*H01L 27/11573*  (2017.01)
*H01L 27/11582*  (2017.01)

(52) U.S. Cl.
CPC .... *H01L 23/5223* (2013.01); *H01L 27/11573* (2013.01); *H01L 27/11582* (2013.01)

(58) Field of Classification Search
CPC ......... H01L 27/11551; H01L 27/11552; H01L 27/11553; H01L 27/11554; H01L 27/11555; H01L 27/11556; H01L 27/11573; H01L 27/11582; H01L 23/5223; H01L 21/76895; H01L 21/76897; H01L 21/10891; H01L 21/10894; H01L 21/10897; H01L 21/10888; H01L 28/40; H01L 28/60; H01L 28/86; H01L 28/90; H01L 27/10805; H01L 27/10808; H01L 27/10811; H01L 27/10823; H01L 27/10829; H01L 27/10838; H01L 27/10847; H01L 27/10852; H01L 27/10855; H01L 27/11568; H01L 27/1157; H01L 27/11575; H01L 29/66833; H01L 29/792; H01L 28/91
USPC .......................................................... 257/298
See application file for complete search history.

(56) References Cited

U.S. PATENT DOCUMENTS

| 8,519,510 | B2 | 8/2013 | Doyle et al. | |
|---|---|---|---|---|
| 2006/0094186 | A1* | 5/2006 | Mitani | H01L 21/76834 |
| | | | | 438/253 |
| 2011/0117718 | A1* | 5/2011 | Nakamura | H01L 27/10852 |
| | | | | 438/387 |
| 2011/0183488 | A1* | 7/2011 | Takaishi | H01L 21/76897 |
| | | | | 438/381 |

(Continued)

FOREIGN PATENT DOCUMENTS

KR    1020150126216 A    11/2015

*Primary Examiner* — Khiem D Nguyen
(74) *Attorney, Agent, or Firm* — William Park & Associates Ltd.

(57) ABSTRACT

A semiconductor memory device, and a method of manufacturing the same, includes: a gate stack structure including interlayer insulating layers and conductive patterns stacked in a first direction; a channel structure penetrating the gate stack structure; a peripheral contact plug spaced apart from the gate stack structure on a plane intersecting the channel structure, the peripheral contact plug extending in the first direction; and a capacitor spaced apart from the gate stack structure and the peripheral contact plug on the plane, the capacitor having an area wider than an area of the peripheral contact plug.

17 Claims, 31 Drawing Sheets

(56) References Cited

U.S. PATENT DOCUMENTS

| | | | |
|---|---|---|---|
| 2014/0061748 A1* | 3/2014 | Lee | H01L 27/11575 257/314 |
| 2016/0163783 A1* | 6/2016 | Sasaki | H01L 27/10814 257/532 |
| 2018/0122814 A1* | 5/2018 | Baraskar | H01L 27/1157 |
| 2019/0267088 A1* | 8/2019 | Jeon | H01L 23/5329 |

* cited by examiner

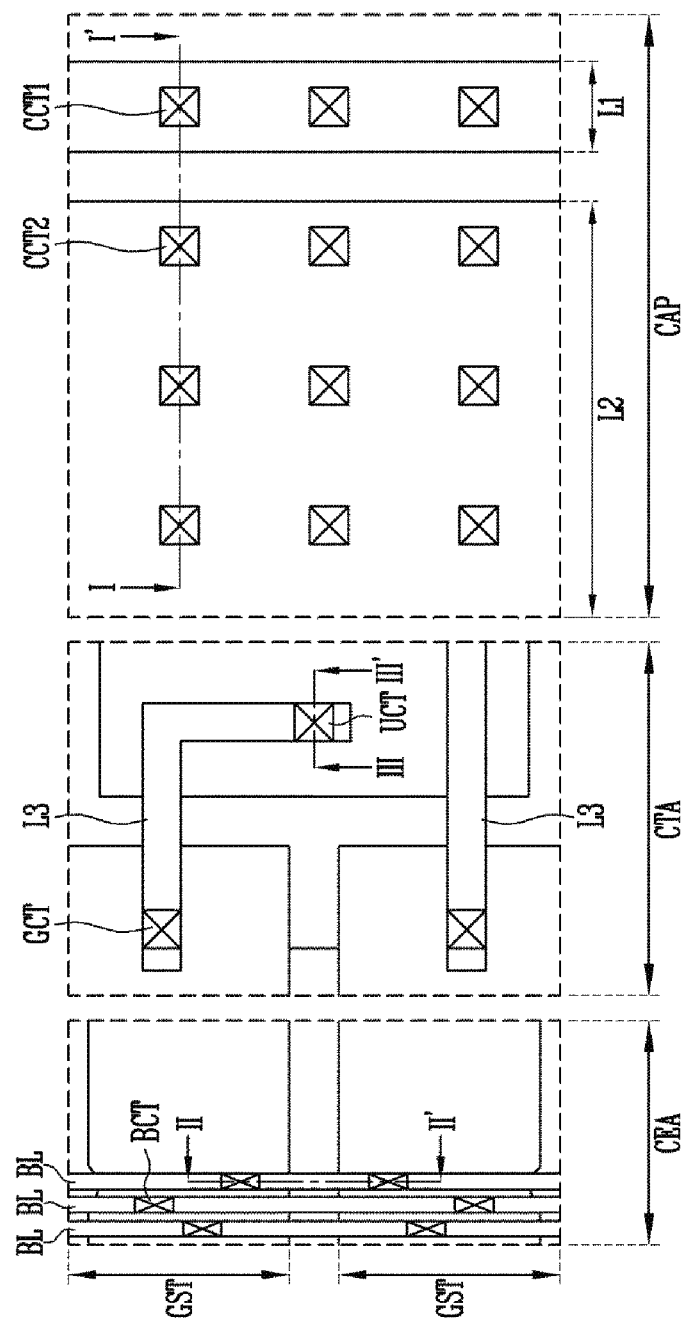

(CAP)

(CAP)

(CAP)

(CAP)

(CAP)

SEMICONDUCTOR MEMORY DEVICE HAVING CAPACITOR SPACED APART FROM A GATE STACK STRUCTURE

CROSS-REFERENCE TO RELATED APPLICATION

The present application claims priority under 35 U.S.C. § 119(a) to Korean patent application number 10-2019-0161860, filed on Dec. 6, 2019, in the Korean Intellectual Property Office, the entire disclosure of which is incorporated herein by reference.

BACKGROUND

1. Technical Field

Various embodiments of the present disclosure relate to a semiconductor memory device and a method of manufacturing the semiconductor memory device, and more particularly, to a three-dimensional (3D) semiconductor memory device and a method of manufacturing the 3D semiconductor memory device.

2. Related Art

In order to achieve high-density integration of semiconductor memory devices, a three-dimensional (3D) memory device including memory cells arranged in three dimensions has been proposed. Such a 3D memory device allows for an increase in the array density of memory cells arranged in a limited area and a decrease in chip size. Operation of the 3D memory device requires an increase in the capacitance of a capacitor.

SUMMARY

In accordance with an embodiment of the present disclosure, a semiconductor memory device includes: a gate stack structure including interlayer insulating layers and conductive patterns stacked in a first direction; a channel structure penetrating the gate stack structure; a peripheral contact plug spaced apart from the gate stack structure on a plane intersecting the channel structure, the peripheral contact plug extending in the first direction; and a capacitor spaced apart from the gate stack structure and the peripheral contact plug on the plane, the capacitor having an area wider than an area of the peripheral contact plug. The capacitor includes a first capacitor electrode including a groove, a dielectric layer on a surface of the groove, and a second capacitor electrode on the dielectric and filling the groove.

In accordance with an embodiment of the present disclosure, a semiconductor memory device includes a lower conductive pattern, a vertical contact plug extending from the lower conductive pattern in a first direction, a first upper conductive pattern coupled to the vertical contact plug, a first capacitor coupled to the lower conductive pattern, a second capacitor coupled to the lower conductive pattern, and a second upper conductive pattern coupled to the first capacitor and the second capacitor. Each of the first capacitor and the second capacitor includes a first capacitor electrode including a horizontal component in contact with the lower conductive pattern and extending in parallel with the lower conductive pattern and a vertical component extending from the horizontal component in the first direction, a dielectric layer formed on the first capacitor electrode, and a second capacitor electrode formed on the dielectric layer and extending in parallel with the vertical component.

In accordance with an embodiment of the present disclosure, a method of manufacturing a semiconductor memory device includes: forming a lower insulating layer in which an interconnection pattern and a lower conductive pattern are embedded; forming a stack structure on the lower insulating layer, the stack structure including interlayer insulating layers and sacrificial insulating layers alternately stacked in a first direction; forming a first opening and a second opening to penetrate the stack structure and the lower insulating layer and expose the lower conductive pattern; forming a first capacitor electrode on a surface of the first opening; forming a dielectric layer on a surface of the first capacitor electrode; and forming a second capacitor electrode on the dielectric to fill the first opening. The second opening is filled with a vertical contact plug while the first capacitor electrode is formed.

BRIEF DESCRIPTION OF THE DRAWINGS

FIGS. 3A and 3B are plan views illustrating a semiconductor memory device according to an embodiment of the present disclosure.

DETAILED DESCRIPTION

The specific structural or functional descriptions disclosed herein are merely illustrative for the purpose of describing embodiments according to the concept of the present disclosure. The embodiments may be implemented in various forms, and should not be construed as being limited to the specific embodiments set forth herein.

Various embodiments of the present disclosure are directed to a semiconductor memory device including a capacitor and a method of manufacturing the semiconductor memory device.

Figure 1:
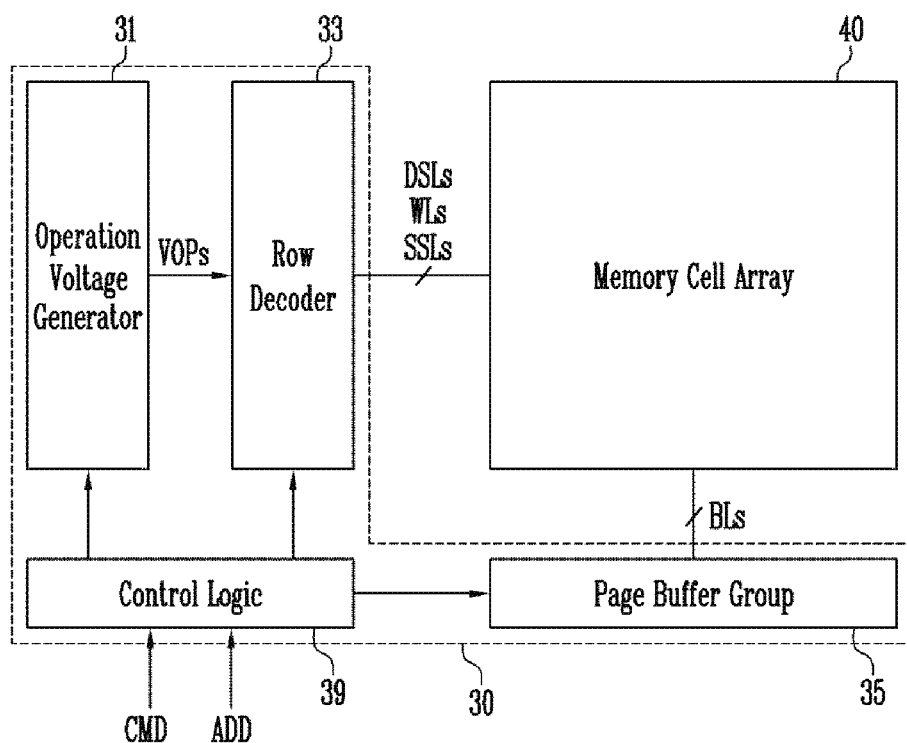
FIG. 1 is a block diagram illustrating a semiconductor memory device according to an embodiment of the present disclosure.

FIG. 1 is a block diagram illustrating a semiconductor memory device 10 according to an embodiment of the present disclosure.

Referring to FIG. 1, the semiconductor memory device 10 may include a peripheral circuit 30 and a memory cell array 40.

The peripheral circuit 30 may perform a program operation of storing data in the memory cell array 40, a read operation of outputting data stored in the memory cell array 40, and an erase operation of erasing data stored in the memory cell array 40. In an embodiment, the peripheral circuit 30 may include control logic 39, an operation voltage generator 31, a row decoder 33, and a page buffer group 35.

The memory cell array 40 may include a plurality of memory blocks. Respective memory blocks may be coupled to drain select lines DSLs, word lines WLs, source select lines SSLs, and bit lines BLs.

The control logic 39 may control the peripheral circuit 30 in response to a command CMD and an address ADD. The control logic 39 may be implemented as hardware, software, or a combination of hardware and software. For example, the control logic 39 may be a control logic circuit operating in accordance with an algorithm and/or a processor executing control logic code.

The operation voltage generator 31 may generate various operation voltages VOPs that are used for a program operation, a read operation, and an erase operation under the control of the control logic 39. The operation voltages VOPs may include a program voltage, a verify voltage, a pass voltage, a select line voltage, etc.

The row decoder 33 may select a memory block under the control of the control logic 39. The row decoder 33 may apply the operation voltages VOPs to drain select lines DSLs, word lines WLs, and source select lines SSLs which are coupled to the selected memory block.

The page buffer group 35 may be coupled to the memory cell array 40 through the bit lines BLs. The page buffer group 35 may temporarily store data received from an input/output circuit (not illustrated) under the control of the control logic 39 during a program operation. The page buffer group 35 may sense voltages or currents of the bit lines BLs under the control of the control logic 39 during a read operation or a verify operation.

Figure 2A:
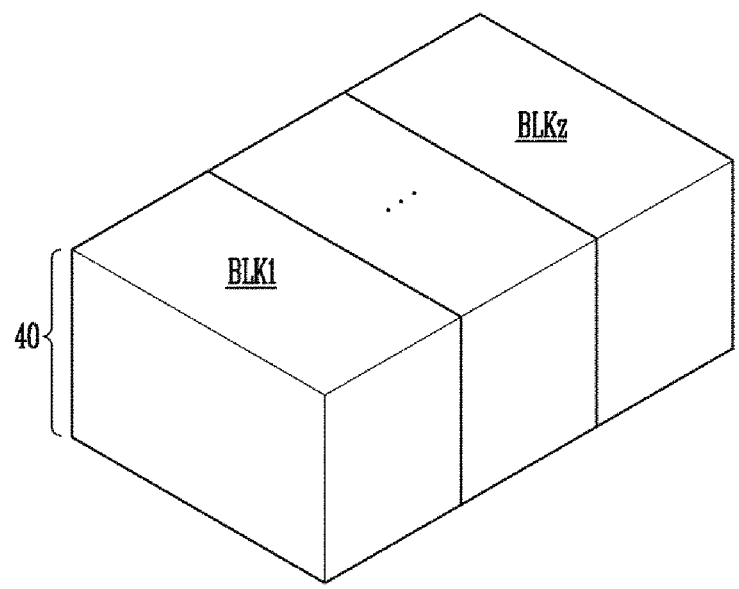
FIGS. 2A and 2B are diagrams illustrating an embodiment of a memory cell array illustrated in FIG. 1.
Figure 2B:
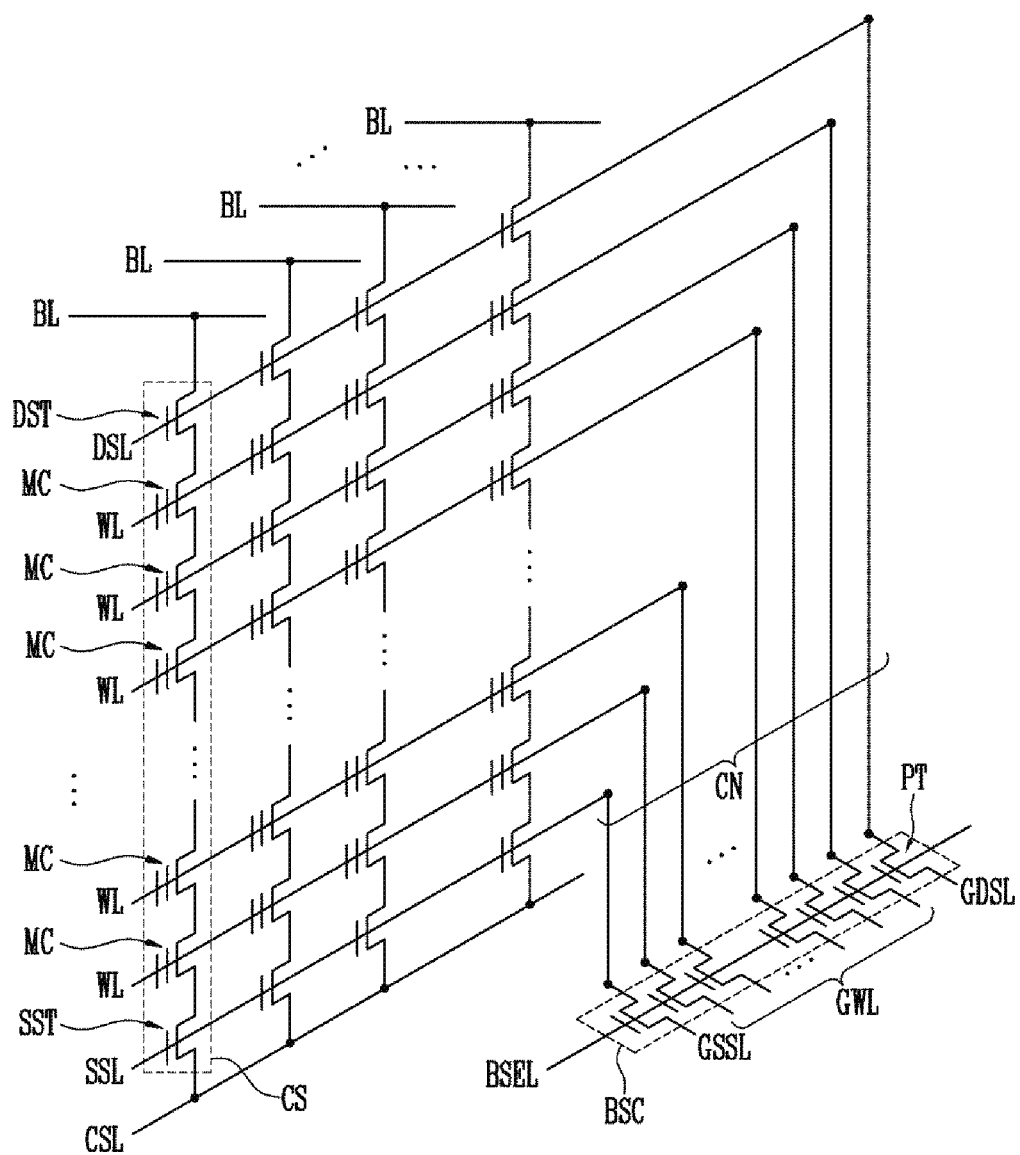

FIGS. 2A and 2B are diagrams illustrating an embodiment of the memory cell array 40 illustrated in FIG. 1.

FIG. 2A is a block diagram illustrating the schematic configuration of the memory cell array 40.

Referring to FIG. 2A, the memory cell array 40 may include a plurality of memory blocks BLK1 to BLKz. Each of the memory blocks BLK1 to BLKz may include a plurality of memory cell strings.

FIG. 2B is a circuit diagram illustrating an embodiment of memory cell strings CS.

Referring to FIG. 2B, the memory cell strings CS constituting each memory block may be arranged in a plurality of rows and columns. FIG. 2B illustrates memory cell strings CS constituting one of the plurality of rows for convenience of description.

The memory cell strings CS constituting each row may be coupled to the bit lines BL, respectively. The memory cell strings CS may be coupled to a common source structure CSL.

Each of the memory cell strings CS may include a source select transistor SST, a plurality of memory cells MC, and a drain select transistor DST, which are stacked between the common source structure CSL and a bit line BL corresponding thereto.

The source select transistor SST may control electrical coupling between the memory cell string CS corresponding thereto and the common source structure CSL. The drain select transistor DST may control electrical coupling between the memory cell string CS corresponding thereto and the bit line BL corresponding thereto.

One source select transistor SST, or two or more series-connected source select transistors SST may be arranged between the common source structure CSL and the plurality of memory cells MC. One drain select transistor DST, or two or more series-connected drain select transistors DST may be arranged between the bit line BL and the plurality of memory cells MC.

The plurality of memory cells MC may be coupled to the plurality of word lines WL, respectively. The operations of the plurality of memory cells MC may be controlled in response to cell gate signals applied to the plurality of word lines WL. The source select transistor SST may be coupled to the source select line SSL. The operation of the source select transistor SST may be controlled in response to a source select gate signal applied to the source select line SSL. The drain select transistor DST may be coupled to the drain select line DSL. The operation of the drain select transistor DST may be controlled in response to a drain select gate signal applied to the drain select line DSL.

The word lines WL may be arranged to be spaced apart from each other between the source select line SSL and the drain select line DSL. The source select line SSL, the drain select line DSL, and the word lines WL may individually extend in a row direction.

The source select line SSL, the drain select line DSL, and the word lines WL may be implemented using conductive patterns that are stacked while being spaced apart from each other. The conductive patterns and interlayer insulating layers may be alternately stacked to form a gate stack structure. The source select transistor SST, the memory cells MC, and the drain select transistor DST in each of the memory cell strings CS may be coupled in series to each other through a channel structure penetrating the gate stack structure.

The source select line SSL, the drain select line DSL, and the word lines WL may be coupled to a block select circuit BSC. The block select circuit BSC may form a part of the row decoder 33, described above with reference to FIG. 1. The block select circuit BSC according to an embodiment may include pass transistors PT coupled to the source select line SSL, the drain select line DSL, and the word lines WL, respectively. Gates of the pass transistors PT may be coupled to a block select line BSEL. The pass transistors PT may transfer voltages, applied to global lines GSSL, GWL, and GDSL, to the source select line SSL, the drain select line DSL, and the word lines WL in response to a block select signal applied to the block select line BSEL.

The block select circuit BSC may be coupled to conductive patterns forming the source select line SSL, the drain select line DSL, and the word lines WL via coupling structures CN. The coupling structures CN may include gate contact plugs respectively extending from the conductive patterns of the gate stack structure, interconnection patterns coupled to the peripheral circuit, peripheral contact plugs respectively coupled to the interconnection patterns, and upper conductive patterns configured to couple the peripheral contact plugs to the gate contact plugs.

Figure 3A:
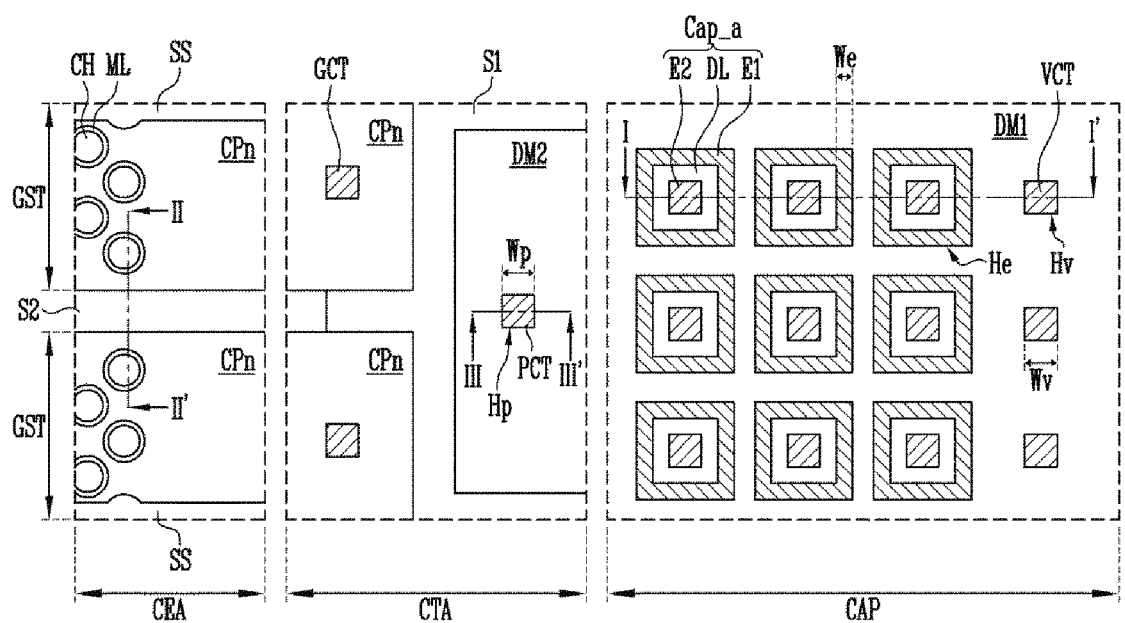

FIGS. 3A and 3B are plan views illustrating a semiconductor memory device according to an embodiment of the present disclosure. FIG. 3A is a plan view taken along a plane intersecting channel structures CH, and FIG. 3B is a plan view illustrating the layout of bit lines BL and upper conductive patterns L1 to L3.

Referring to FIGS. 3A and 3B, the semiconductor memory device may include a cell array area CEA, a contact area CTA, and a capacitor area CAP.

The channel structures CH may be arranged in the cell array area CEA. The channel structures CH may penetrate gate stack structures GST. Each of the gate stack structures GST may extend to the contact area CTA. The gate stack structures GST may be isolated from each other by first and second slits S1 and S2 coupled to each other.

Figure 4A:
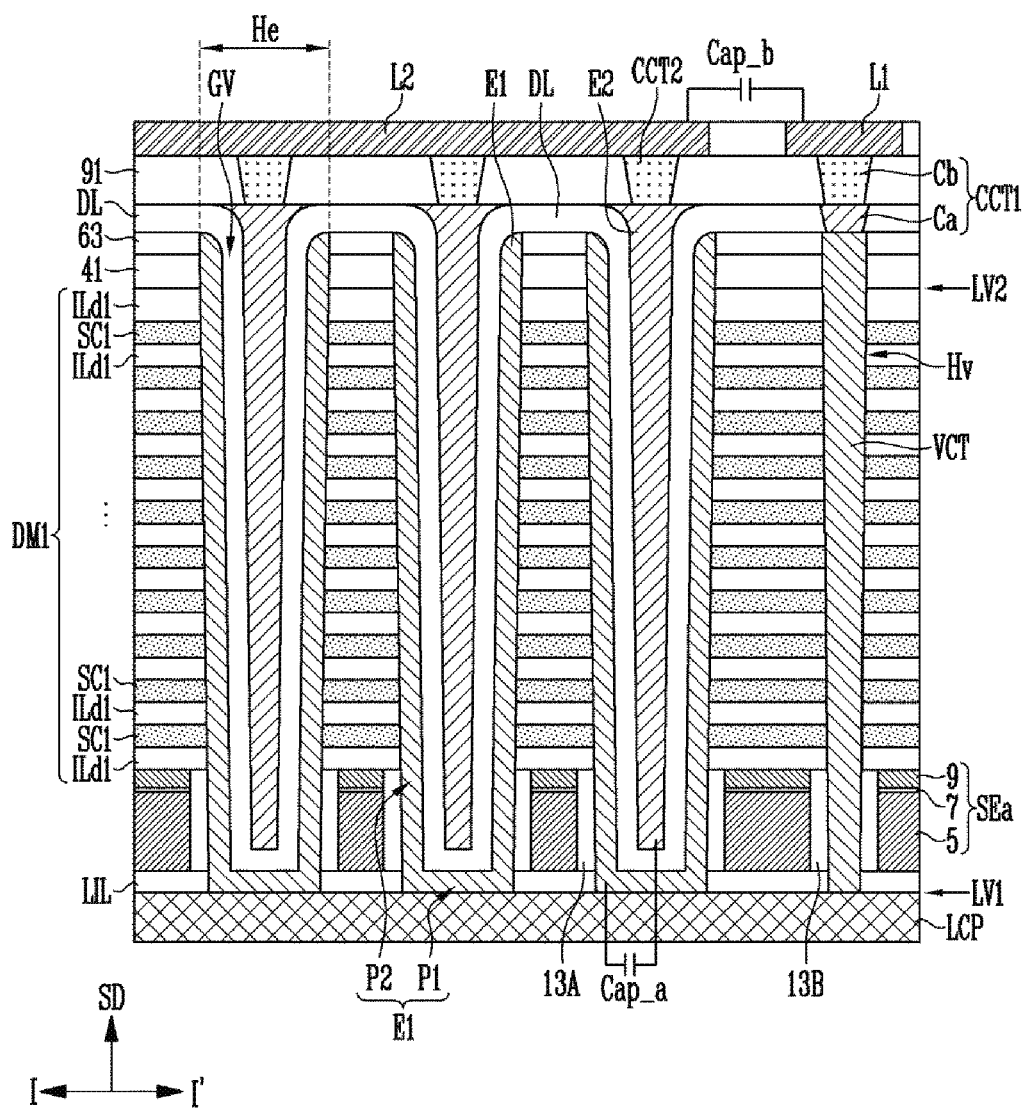
FIGS. 4A to 4C are sectional views illustrating a semiconductor memory device according to an embodiment of the present disclosure.
Figure 4B:
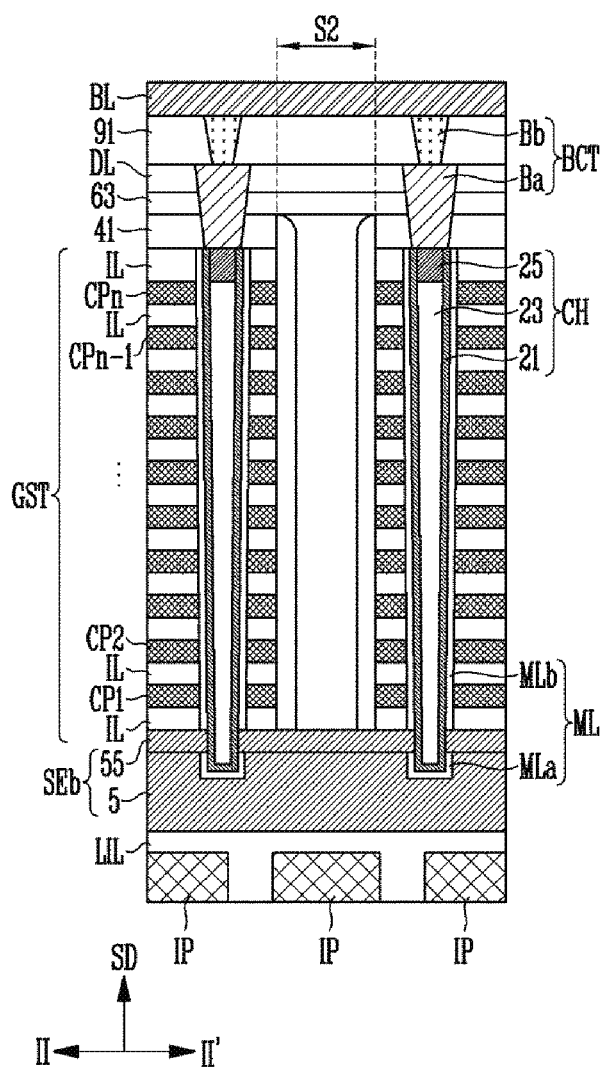

Each of the gate stack structures GST may include a plurality of conductive patterns CP1 to CPn (where n is a natural number), as illustrated in FIG. 4B. The conductive patterns CP1 to CPn may also be used as the source select line SSL, the word lines WL, and the drain select line DSL, described above with reference to FIG. 2B. Among the conductive patterns CP1 to CPn, the conductive patterns CPn disposed at least on the uppermost layer may be separated into a plurality of select lines by a select line separation structure SS. Although not illustrated in the drawings for convenience of description, the channel structures CH penetrating respective gate stack structures GST may be arranged symmetrically with respect to the select line separation structure SS.

Respective channel structures CH may be used as channel areas of memory cell strings corresponding thereto. Each of the channel structures CH may be surrounded by a memory layer ML. Each memory layer ML may include a data storage layer used as a data storage area of the memory cell corresponding thereto.

The channel structures CH may be arranged in zigzags. The present disclosure is not limited thereto. For example, the array of the channel structures CH may form a matrix structure.

Each of the conductive patterns CP1 to CPn may be coupled to a gate contact plug GCT corresponding thereto in the contact area CTA. The gate contact plug GCT may be included in the coupling structure CN, described above with reference to FIG. 2B. The coupling structure CN may include a peripheral contact plug PCT arranged in the contact area CTA.

Capacitors Cap_a and vertical contact plugs VCT may be arranged in the capacitor area CAP.

Each of the capacitors Cap_a may include a first capacitor electrode E1, a second capacitor electrode E2, and a dielectric layer DL interposed between the first capacitor electrode E1 and the second capacitor electrode E2. The array of the capacitors Cap_a may form a matrix structure having a plurality of columns and a plurality of rows. The present disclosure is not limited thereto. In an embodiment, the array of the capacitors Cap_a may form a zigzag.

The vertical contact plugs VCT may be arranged in a line. The present disclosure is not limited thereto. In an embodiment, the vertical contact plugs VCT may be arranged in zigzags.

The capacitors Cap_a may be respectively disposed in first penetration areas He penetrating a first dummy stack structure DM1. The vertical contact plugs VCT may be respectively disposed in second penetration areas Hv penetrating the first dummy stack structure DM1. The first dummy stack structure DM1 may include first dummy interlayer insulating layers ILd1 and first sacrificial insulating layers SC1 that are alternately arranged, as illustrated in FIG. 4A. On the plane intersecting the channel structures CH, the first dummy stack structure DM1 may be spaced apart from the gate stack structures GST.

Respective structures of the capacitors Cap_a and the vertical contact plugs VCT may be designed such that, while the first capacitor electrode E1 is formed, each of the second penetration areas Hv may be filled with the vertical contact plug VCT corresponding thereto. In an embodiment, at the same level, the area of each capacitor Cap_a may be formed wider than that of the corresponding vertical contact plug VCT. In other words, at the same level, the area of each of the first penetration areas He may be formed wider than that of each of the second penetration areas Hv.

The width We of the first capacitor electrode E1 may be designed such that, even if each of the vertical contact plugs VCT completely fills the corresponding second penetration area Hv, a groove GV, such as that illustrated in FIG. 4A, may be defined in the central region of the first capacitor electrode E1. In an embodiment, the width We of the first capacitor electrode E1 may be formed narrower than the width Wv of each of the vertical contact plugs VCT.

Figure 4C:
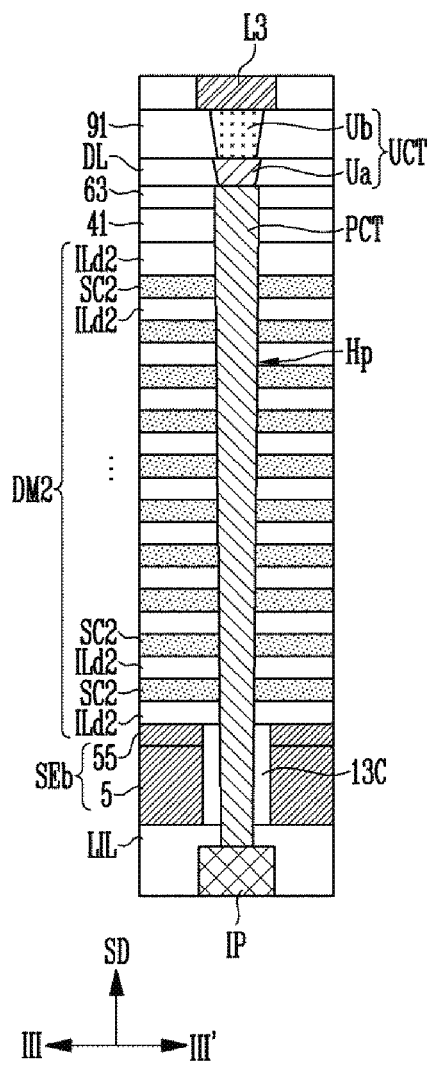

The peripheral contact plug PCT may be disposed in a contact hole Hp penetrating the second dummy stack structure DM2. The second dummy stack structure DM2 may include second dummy interlayer insulating layers ILd2 and second sacrificial insulating layers SC2 that are alternately arranged, as illustrated in FIG. 4C. On the plane intersecting the channel structures CH, the second dummy stack structure DM2 may be spaced apart from the gate stack structures GST. The second dummy stack structure DM2 may be spaced apart from the gate stack structures GST by the first slit S1.

The structure of the peripheral contact plug PCT may be designed such that, while the first capacitor electrode E1 is formed, the contact hole Hp may be filled with the peripheral contact plug PCT. In an embodiment, at the same level, the area of each of the capacitors Cap_a may be formed wider than that of the peripheral contact plug PCT. In other words, at the same level, the area of each first penetration area He may be formed wider than that of the contact hole Hp.

The width We of the first capacitor electrode E1 may be formed narrower than the width Wp of the peripheral contact plug PCT so that, even if the peripheral contact plug PCT completely fills the contact hole Hp, the groove GV, such as that illustrated in FIG. 4A, may be defined in the central region of the first capacitor electrode E1.

Although respective cross-sections of the contact hole Hp, the gate contact plug GCT, the first penetration areas He, and the second penetration areas Hv are illustrated as having rectangular shapes in FIG. 3A, the present disclosure is not limited thereto. Respective cross-sections of the contact hole Hp, the gate contact plug GCT, the first penetration areas He, and the second penetration areas Hv may be designed to have various shapes, such as circular, elliptical, and linear shapes.

The gate contact plug GCT, the peripheral contact plug PCT, the capacitors Cap_a, and the vertical contact plug VCT may be spaced apart from each other on the plane intersecting the channel structures CH. The peripheral contact plug PCT, the capacitors Cap_a, and the vertical contact plug VCT may be spaced apart from the gate stack structures GST on the plane intersecting the channel structures CH.

Referring to FIG. 3B, the bit lines BL and the upper conductive patterns L1 to L3 may be arranged at a level higher than the level at which the gate stack structures GST, the first dummy stack structure DM1, and the second dummy stack structure DM2, described with reference to FIG. 3A, are arranged.

The upper conductive patterns L1 to L3 may include a first upper conductive pattern L1, a second upper conductive pattern L2, and a third upper conductive pattern L3. The first upper conductive pattern L1 may be coupled to the vertical contact plugs VCT, described with reference to FIG. 3A, via first capacitor contact structures CCT1. The second upper conductive pattern L2 may be coupled to the second capacitor electrodes E2 of respective capacitors Cap_a, described with reference to FIG. 3A, via second capacitor contact structures CCT2. A first end of the third upper conductive pattern L3 may be coupled to the gate contact plug GCT corresponding thereto. A second end of the third upper conductive pattern L3 may be coupled to an upper contact structure UCT corresponding thereto. The upper contact structure UCT may overlap the peripheral contact plug PCT, described with reference to FIG. 3A. The peripheral contact plug PCT may be coupled to the third upper conductive pattern L3 via the upper contact structure UCT.

The bit lines BL may be coupled to the channel structures CH, described with reference to FIG. 3A, via the bit line contact structures BCT.

FIGS. 4A to 4C are sectional views illustrating a semiconductor memory device according to an embodiment of the present disclosure. Hereinafter, a first direction SD may be defined as a direction in which first dummy interlayer insulating layers ILd1 and first sacrificial insulating layers SC1 are stacked. Alternatively, the first direction SD may be defined as a direction orthogonal to a plane that intersects the channel structures CH, the vertical contact plug VCT, and the peripheral contact plug PCT, described above with reference to FIG. 3A.

FIG. 4A is a sectional view taken along line I-I' of FIGS. 3A and 3B.

Referring to FIG. 4A, the first dummy stack structure DM1 may overlap a lower conductive pattern LCP. The lower conductive pattern LCP may be embedded in a lower insulating layer LIL. The lower insulating layer LIL, which is an insulating layer extending to cover a substrate (not illustrated) including the peripheral circuit 30, described above with reference to FIG. 1, may include insulating layers having a multilayer structure.

The first dummy interlayer insulating layers ILd1 and the first sacrificial insulating layers SC1 of the first dummy stack structure DM1 may be alternately stacked in the first direction SD. The lower insulating layer LIL may extend to a region between the first dummy stack structure DM1 and the lower conductive pattern LCP.

The first dummy stack structure DM1 may be disposed over the lower insulating layer LIL, with a dummy semiconductor pattern SEa being interposed therebetween. The dummy semiconductor pattern SEa may be penetrated by first insulating patterns 13A and second insulating patterns 13B.

Each of the first penetration areas He may penetrate the first insulating pattern 13A and the first dummy stack structure DM1, which correspond thereto. Each of the first penetration areas He may extend in the first direction SD to penetrate a first upper insulating layer 41 and a second upper insulating layer 63 stacked on the top of the first dummy stack structure DM1. Each of the first penetration areas He may penetrate the lower insulating layer LIL, and may have a bottom surface defined by a top surface of the lower conductive pattern LCP.

The first capacitor electrode E1 of each of the capacitors Cap_a may extend to be in contact with the lower conductive pattern LCP. Each of the first insulating patterns 13A may remain in a structure enclosing a lower portion of the first capacitor electrode E1 corresponding thereto.

The first capacitor electrode E1 may include a horizontal component P1 and a vertical component P2. The horizontal component P1 is in contact with the lower conductive pattern LCP, and may extend in parallel with the lower conductive pattern LCP. The vertical component P2 may extend from the horizontal component P1 in the first direction SD. The vertical component P2 may extend from the edge of the horizontal component P1, and a groove GV may be defined in the first capacitor electrode E1 by the horizontal component P1 and the vertical component P2.

The width We of the first capacitor electrode E1, described with reference to FIG. 3A, may be the width of the vertical component P2 measured on a plane between the first level LV1 and the second level LV2. The first level LV1 may be a level at which the plane on which the first capacitor electrode E1 and the lower conductive pattern LCP are in contact with each other is arranged, and the second level LV2 may be a level at which a top surface of the first dummy stack structure DM1 is arranged.

The dielectric layer DL of each capacitor Cap_a may be formed on the first capacitor electrode E1, and may be formed along the surface of the groove GV. The dielectric layer DL may be formed of various insulating materials. In an embodiment, the dielectric layer DL may include an oxide layer. The dielectric layer DL may extend to cover the second upper insulating layer 63.

The second capacitor electrode E2 of each capacitor Cap_a may fill the groove GV on the dielectric layer DL. The second capacitor electrode E2 may extend in the first direction SD in parallel with the vertical component P2.

The first capacitor electrode E1 and the dielectric layer DL may extend to a region between the second capacitor electrode E2 and the lower conductive pattern LCP.

Each of the second penetration areas Hv may penetrate the second insulating pattern 13B and the first dummy stack structure DM1, which correspond thereto. Each of the second penetration areas Hv may extend in the first direction SD to penetrate the first upper insulating layer 41 and the second upper insulating layer 63. Each of the second penetration areas Hv may penetrate the lower insulating layer LIL, and may have a bottom surface defined by the top surface of the lower conductive pattern LCP.

The vertical contact plug VCT filling each second penetration area Hv may be in contact with the lower conductive pattern LCP, and may extend in the first direction SD. Each of the second insulating patterns 13B may remain in a structure enclosing a lower portion of the vertical contact plug VCT corresponding thereto. The vertical contact plug VCT may extend in the first direction SD in parallel with the vertical component P2 of the first capacitor electrode E1 and the second capacitor electrode E2.

The dielectric layer DL may extend to cover the vertical contact plug VCT. The dielectric layer DL and the second capacitor electrodes E2 may be covered with a third upper insulating layer 91. The first upper conductive pattern L1 and the second upper conductive pattern L2 may be spaced apart from each other on the third upper insulating layer 91.

The first upper conductive pattern L1 may overlap the first capacitor contact structure CCT1 extending from the vertical contact plug VCT in the first direction SD. The first upper conductive pattern L1 may be electrically coupled to the vertical contact plug VCT via the first capacitor contact structure CCT1.

The first capacitor contact structure CCT1 may penetrate the dielectric layer DL, extending to a region between the first upper conductive pattern L1 and the vertical contact plug VCT, and the third upper insulating layer 91. The first capacitor contact structure CCT1 may include a lower plug Ca penetrating the dielectric layer DL and an upper plug Cb penetrating the third upper insulating layer 91.

The second upper conductive pattern L2 may be arranged to face the first upper conductive pattern L1. The second upper conductive pattern L2 may overlap the second capacitor contact structure CCT2 extending from the second capacitor electrode E2 in the first direction SD. The second upper conductive pattern L2 may be electrically coupled to the second capacitor electrode E2 via the second capacitor contact structure CCT2.

An upper capacitor Cap_b may be defined between the first upper conductive pattern L1 and the second upper conductive pattern L2.

Two or more capacitors Cap_a may be coupled in parallel to the lower conductive pattern LCP and the second upper conductive pattern L2. For example, a first capacitor and a second capacitor may be coupled in parallel to the lower conductive pattern LCP and the second upper conductive pattern L2.

In accordance with the above-described structure, voltages to be applied to the first upper conductive pattern L1 and the second upper conductive pattern L2 may be differently controlled to accumulate charges in the capacitors Cap_a. For example, a first voltage may be applied to the first upper conductive pattern L1, and a second voltage lower than the first voltage may be applied to the second upper conductive pattern L2. The first voltage may be applied to the first capacitor electrodes E1 of respective capacitors Cap_a via the first capacitor contact structure CCT1, the vertical contact plug VCP, and the lower conductive pattern LCP, and the second voltage may be applied to the second capacitor electrodes E2 of respective capacitors Cap_a via the second capacitor contact structure CCT2.

FIG. 4B is a sectional view taken along line II-II' of FIGS. 3A and 3B, and FIG. 4C is a sectional view taken along line III-III' of FIGS. 3A and 3B.

Referring to FIGS. 4B and 4C, the lower insulating layer LIL may extend to overlap gate stack structures GST and the second dummy stack structure DM2. Interconnection patterns IP may be disposed in the lower insulating layer LIL. FIGS. 4B and 4C illustrate interconnection patterns IP disposed at the same level as the lower conductive pattern LCP, described with reference to FIG. 4A.

Some of the interconnection patterns IP may be included in coupling structures CN, described above with reference to FIG. 2B. In an embodiment, an interconnection pattern IP overlapping the second dummy stack structure DM2 may be included in any one of the coupling structures CN.

Referring to FIG. 4B, each of the gate stack structures GST may include interlayer insulating layers IL and conductive patterns CP1 to CPn, which are alternately stacked in the first direction SD. Each of the conductive patterns CP1 to CPn may include various conductive materials, such as a doped silicon layer, a metal layer, a metal silicide layer, and a barrier layer, and may include two or more types of conductive materials.

The conductive patterns CP1 to CPn may also be used as the source select line SSL, the word lines WL, and the drain select line DSL, described above with reference to FIG. 2B. For example, among the conductive patterns CP1 to CPn, the first conductive pattern CP1 may be used as the source select line SSL, and the n-th conductive pattern CPn may be used as the drain select line DSL. The conductive patterns (e.g., CP2 to CPn-1) between the source select line SSL and the drain select line DSL may be used as the word lines WL.

The gate stack structures GST may be spaced apart from each other, with a second slit S2 being interposed therebetween. The second slit S2 may be filled with an insulating material or with an insulating material and a conductive material.

Each channel structure CH may penetrate the gate stack structure GST corresponding thereto. The channel structure CH may be surrounded by a memory layer ML.

The memory layer ML may include a tunnel insulating layer, a data storage layer extending along an outer wall of the tunnel insulating layer, and a blocking insulating layer extending along an outer wall of the data storage layer. The data storage layer may be formed of a material layer capable of storing data. For example, the data storage layer may be formed of a material layer capable of storing data that is changed using fowler-nordheim tunneling. For this operation, the data storage layer may be formed of a nitride layer capable of trapping charges. The present disclosure is not limited thereto, and the data storage layer may include silicon, a phase change material, nanodots, etc. The blocking insulating layer may include an oxide layer capable of blocking charges. The tunnel insulating layer may be formed of a silicon oxide layer enabling charge tunneling.

The channel structure CH may include a first semiconductor layer 21, a core insulating layer 23, and a second semiconductor layer 25. The core insulating layer 23 and the second semiconductor layer 25 may be disposed in the central region of the channel structure CH. The second semiconductor layer 25 may be disposed on the core insulating layer 23. The first semiconductor layer 21 may extend along a sidewall and a bottom surface of the core insulating layer 23, and may extend to enclose the second semiconductor layer 25. The present disclosure is not limited thereto. For example, the core insulating layer 23 may be omitted, and the central region of the channel structure CH may be filled with the first semiconductor layer 21. The second semiconductor layer 25 may contain doped silicon. In an embodiment, the second semiconductor layer 25 may contain n-type impurities.

The gate stack structures GST may be disposed over the lower insulating layer LIL, with the doped semiconductor pattern SEb being interposed therebetween. The doped semiconductor pattern SEb may contain at least one of n-type impurities and p-type impurities. In an embodiment, the doped semiconductor pattern SEb may be used as the common source structure CSL, described above with reference to FIG. 2B. The doped semiconductor pattern SEb used as the common source structure CSL may contain n-type impurities.

The channel structure CH may be electrically coupled to the doped semiconductor pattern SEb through a contact surface that is in contact with the doped semiconductor pattern SEb. In an embodiment, a lower portion of the channel structure CH may be surrounded by the doped semiconductor pattern SEb, and the contact surface may be defined by a sidewall of the channel structure CH. That is, the doped semiconductor pattern SEb may be in contact with the sidewall of the channel structure CH. Here, the memory layer ML enclosing the channel structure CH may be penetrated by the doped semiconductor pattern SEb, and may be separated into a first memory pattern MLa and a second memory pattern MLb. The first memory pattern MLa may be interposed between the doped semiconductor pattern SEb and the channel structure CH, and the second memory pattern MLb may be interposed between the gate stack structure GST and the channel structure CH. The doped semiconductor pattern SEb may include a first doped semiconductor layer 5 spaced apart from the channel structure CH by the first memory pattern MLa and a second doped semiconductor layer 55 in contact with the sidewall of the channel structure CH. In an embodiment, the first doped semiconductor layer 5 and the second doped semiconductor layer 55 may each include an n-type doped silicon layer.

The contact surface of the channel structure CH being in contact with the doped semiconductor pattern SEb is not limited to that illustrated in drawings, and may be changed in various forms. In an embodiment, the doped semiconductor pattern SEb may be in contact with the bottom surface of the channel structure CH.

The first upper insulating layer 41, the second upper insulating layer 63, the dielectric layer DL, and the third upper insulating layer 91, described above with reference to FIG. 4A, may extend to overlap the gate stack structures GST. The bit line BL may be spaced apart from the gate stack structures GST, with the first upper insulating layer 41, the second upper insulating layer 63, the dielectric layer DL, and the third upper insulating layer 91 being interposed therebetween. The bit line BL may be electrically coupled to the corresponding channel structure CH through a bit line contact structure BCT.

The bit line contact structure BCT may include a first drain contact plug Ba and a second drain contact plug Bb. The first drain contact plug Ba may penetrate the dielectric layer DL, the second upper insulating layer 63, and the first upper insulating layer 41, and may be coupled to the channel structure CH. The second drain contact plug Bb may penetrate the third upper insulating layer 91, and may be coupled to the first drain contact plug Ba. The bit line BL may be coupled to the second drain contact plug Bb.

Referring to FIG. 4C, the second dummy interlayer insulating layers ILd2 and the second sacrificial insulating layers SC2 of the second dummy stack structure DM2 may be alternately stacked in the first direction SD. The doped semiconductor pattern SEb may extend to a region between the lower insulating layer LIL and the second dummy stack structure DM2. The doped semiconductor pattern SEb may be penetrated by a third insulating pattern 13C. The first upper insulating layer 41 and the second upper insulating layer 63 may extend to overlap the second dummy stack structure DM2.

The contact hole Hp may penetrate the second upper insulating layer 63, the first upper insulating layer 41, the second dummy stack structure DM2, the third insulating pattern 13C, and the lower insulating layer LIL. The contact hole Hp may have a bottom surface defined by a top surface of the interconnection pattern IP corresponding thereto.

The peripheral contact plug PCT may be in contact with the corresponding interconnection pattern IP, and may extend in the first direction SD to fill the contact hole Hp. The third insulating pattern 13C may remain in a structure enclosing a lower portion of the peripheral contact plug PCT.

The interconnection pattern IP coupled to the peripheral contact plug PCT may be electrically coupled to the block select circuit BSC, described above with reference to FIG. 2B. Structures of lines for electrically coupling the interconnection pattern IP to the block select circuit BSC may be variously designed.

The dielectric layer DL and the third upper insulating layer 91 may extend to overlap the second dummy stack structure DM2. The third upper conductive pattern L3 may be coupled to the peripheral contact plug PCT via the upper contact structure UCT. The upper contact structure UCT may include a first contact plug Ua and a second contact plug Ub. The first contact plug Ua may penetrate the dielectric layer DL, and may be coupled to the peripheral contact plug PCT. The second contact plug Ub may penetrate the third upper insulating layer 91, and may be coupled to the first contact plug Ua. The third upper conductive pattern L3 may be coupled to the second contact plug Ub.

Each of the coupling structures CN, described above with reference to FIG. 2B, may include the interconnection pattern IP, the peripheral contact plug PCT, the upper contact structure UCT, and the third upper conductive pattern L3, which are illustrated in FIG. 4C, and the gate contact plug GCT, which is illustrated in FIG. 3A.

Referring to FIGS. 4A to 4C, the first capacitor electrode E1, the vertical contact plug VCT, and the peripheral contact plug PCT may be formed of the same conductive material through the same process. The second capacitor electrode E2, the lower plug Ca, the first drain contact plug Ba, and the first contact plug Ua may be formed of the same conductive material through the same process. The upper plug Cb, the second drain contact plug Bb, and the second contact plug Ub may be formed of the same conductive material through the same process. The first to third upper conductive patterns L1 to L3 and the bit line BL may be formed of the same conductive material through the same process.

The dummy semiconductor pattern SEa may include the first doped semiconductor layer 5 and a protective layer 7 stacked on the first doped semiconductor layer 5. The dummy semiconductor pattern SEa may further include a sacrificial layer 9 stacked on the first doped semiconductor layer 5. The sacrificial layer 9 may include an undoped silicon layer.

An array structure between the stack structure array, including the gate stack structures GST and the first and second dummy stack structures DM1 and DM2, and the lower insulating layer LIL may be changed in various forms depending on the design of the semiconductor memory device without being limited to the embodiments illustrated in FIGS. 4A to 4C.

Figure 5:
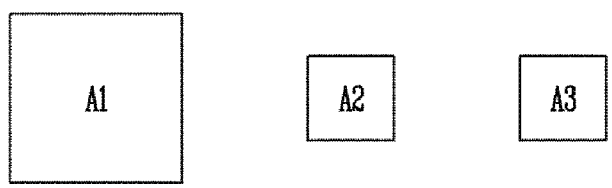
FIG. 5 illustrates first to third areas taken in parallel with a plane intersecting a vertical component between a first level and a second level illustrated in FIG. 4A.

FIG. 5 illustrates first to third areas A1, A2, and A3 taken in parallel with a plane intersecting the vertical component P2 between the first level LV1 and the second level LV2 of FIG. 4A.

Referring to FIG. 5, the first area A1 may be the area of the capacitor Cap_a illustrated in FIGS. 3A and 4A, the area of the first penetration area He illustrated in FIGS. 3A and 4A, or a contact area between the horizontal component P1 and the lower conductive pattern LCP illustrated in FIG. 4A. The second area A2 may be the area of the vertical contact plug VCT illustrated in FIGS. 3A and 4A, or the area of the second penetration area Hv illustrated in FIGS. 3A and 4A. The third area A3 may be the area of the peripheral contact plug PCT illustrated in FIGS. 3A and 4C, or the area of the contact hole Hp illustrated in FIG. 4C.

The first area A1 may be defined wider than the second area A2 and the third area A3 so that, while the first capacitor electrode E1 of the capacitor Cap_a is formed, the vertical contact plug VCT and the peripheral contact plug PCT may be formed. The third area A3 may be identical to or different from the second area A2.

Figure 6A:
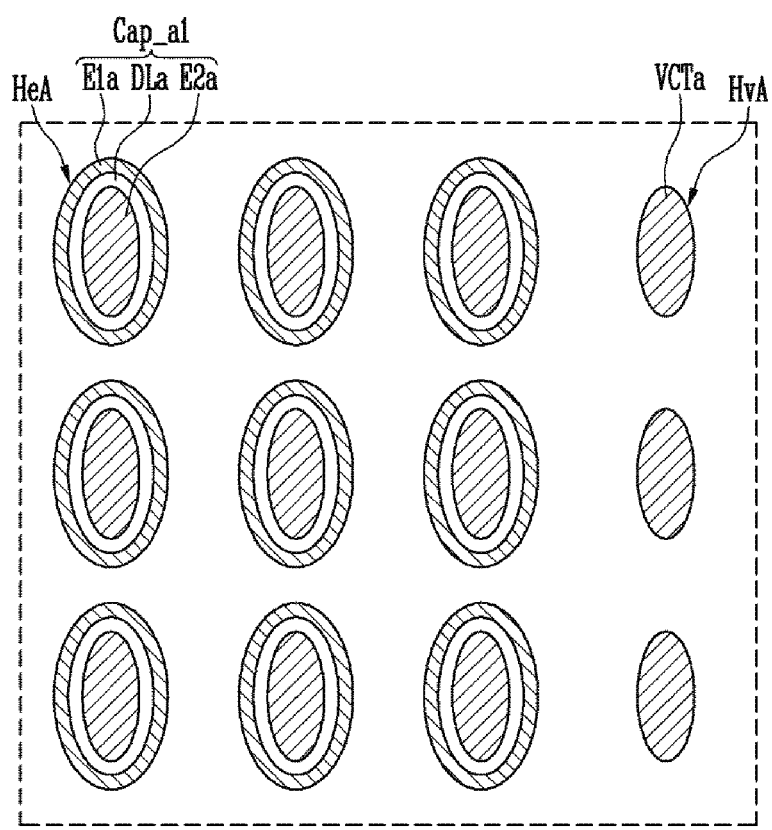
FIGS. 6A to 6C are plan views illustrating capacitors and vertical contact plugs according to various embodiments of the present disclosure.
Figure 6B:
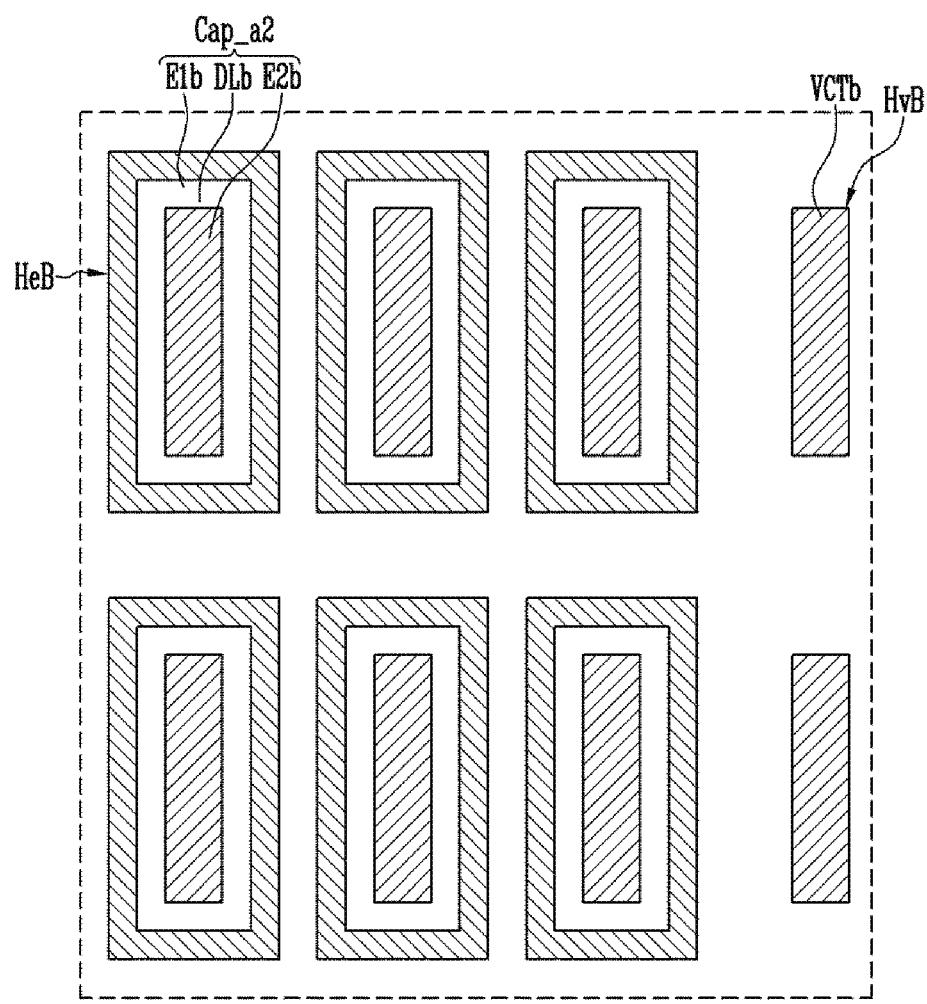
Figure 6C:
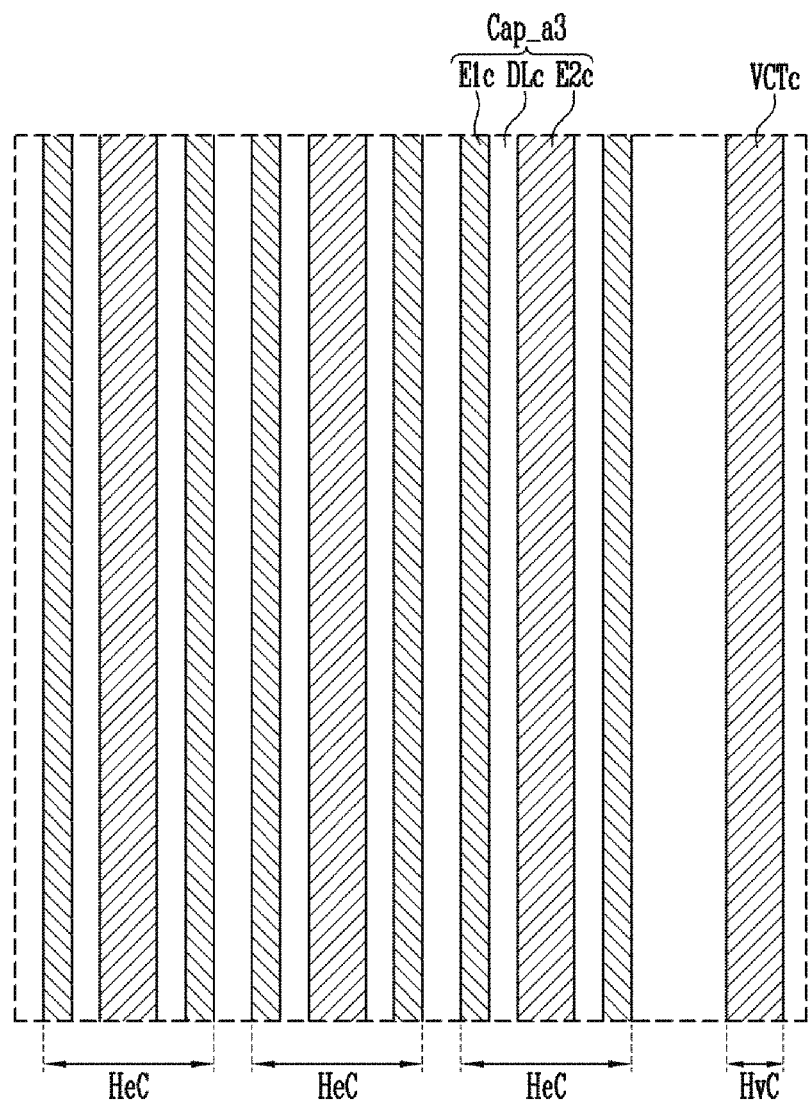

FIGS. 6A to 6C are plan views illustrating capacitors Cap_a1, Cap_a2, and Cap_a3 and vertical contact plugs VCTa, VCTb, and VCTc according to various embodiments of the present disclosure.

Referring to FIGS. 6A to 6C, capacitors Cap_a1, Cap_a2, and Cap_a3 having a vertical structure may be designed in various forms.

In an embodiment, as illustrated in FIG. 6A, the cross-sectional shape of the capacitor Cap_a1 may be an elliptical shape. A first capacitor electrode E1a may be formed on the surface of a first penetration area HeA having an elliptical shape.

In an embodiment, as illustrated in FIG. 6B, the cross-sectional shape of the capacitor Cap_a2 may be a rectangular shape. A first capacitor electrode E1b may be formed on the surface of a first penetration area HeB having a rectangular shape.

In an embodiment, as illustrated in FIG. 6C, the cross-sectional shape of the capacitor Cap_a3 may be a linear shape. A first capacitor electrode E1c may be formed on the sidewall of a first penetration area HeC having a linear shape.

Dielectric layers DLa, DLb, and DLc may be formed on the surfaces of the first capacitor electrodes E1a, E1b, and E1c, respectively, and the second capacitor electrodes E1a, E1b, and E1c may fill central regions of the first penetration areas HeA, HeB, and HeC, respectively.

The vertical contact plugs VCTa, VCTb, and VCTc may be designed in various structures.

In an embodiment, as illustrated in FIG. 6A, the vertical contact plug VCTa may fill a second penetration area HvA having an elliptical cross-sectional shape.

In an embodiment, as illustrated in FIG. 6B, the vertical contact plug VCTb may fill a second penetration area HvB having a rectangular cross-sectional shape.

In an embodiment, as illustrated in FIG. 6C, the vertical contact plug VCTc may fill a second penetration area HvC having a linear cross-sectional shape.

FIGS. 7A and 7B, 8A and 8B, 9, 10A and 10B, 11A and 11B, 12A and 12B, 13A and 13B, 14A and 14B, 15A and 15B, and 16A and 16B are sectional views illustrating a method of manufacturing a semiconductor memory device according to an embodiment of the present disclosure.

The capacitor area CAP of the semiconductor memory device are illustrated in FIGS. 7A, 8A, and 10A to 16A, the cell array area CEA of the semiconductor memory device is illustrated in FIGS. 7B, 8B, 9, and 10B to 16B, and the contact area CTA of the semiconductor memory device are illustrated in FIGS. 7B, 8B, and 10B to 16B.

Figure 7A:
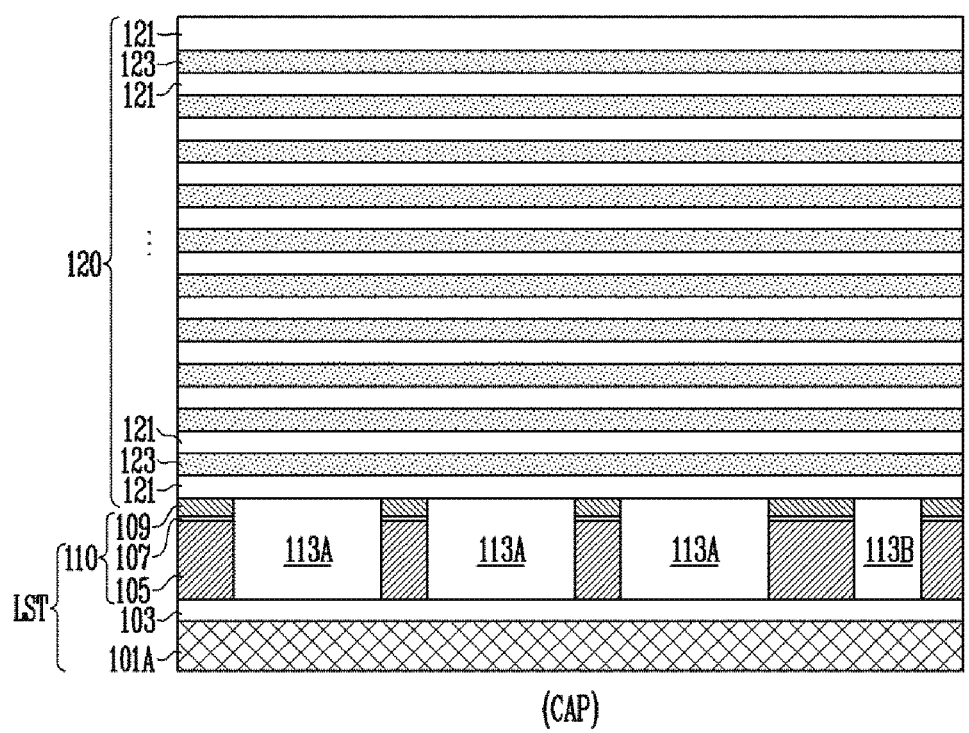
FIGS. 7A and 7B, 8A and 8B, 9, 10A and 10B, 11A and 11B, 12A and 12B, 13A and 13B, 14A and 14B, 15A and 15B, and 16A and 16B are sectional views illustrating a method of manufacturing a semiconductor memory device according to an embodiment of the present disclosure.
Figure 7B:
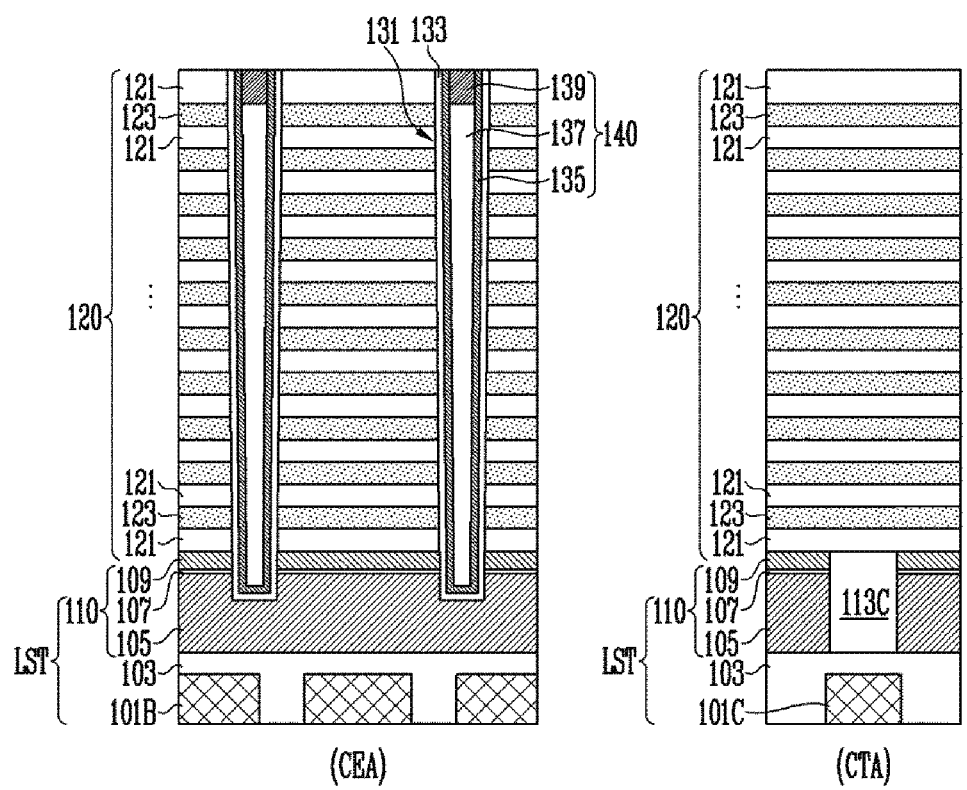

FIGS. 7A to 7B are sectional views illustrating the step of forming a lower structure LST and the step of forming a preliminary stack structure 120 that encloses a channel structure CH.

Referring to FIGS. 7A and 7B, the step of forming the lower structure LST may include the step of forming a lower insulating layer 103 in which a lower conductive pattern 101A and interconnection patterns 101B and 101C are embedded, and the step of forming a semiconductor structure 110 on the lower insulating layer 103.

The lower insulating layer 103 may be formed on a substrate (not illustrated) including the peripheral circuit 30, described above with reference to FIG. 1. The lower conductive pattern 101A and the interconnection patterns 101B and 101C may be made of various types of conductive materials. The interconnection patterns 101B and 101C may include first interconnection patterns 101B arranged in the cell array area CEA and a second interconnection pattern 101C arranged in the contact area CTA.

The semiconductor structure 110 may include a first doped semiconductor layer 105, a protective layer 107, and a sacrificial layer 109, which are sequentially stacked on the lower insulating layer 103. The semiconductor structure 110 of the present disclosure is not limited thereto. In an embodiment, the semiconductor structure 110 may be implemented as a single layer formed of a doped semiconductor layer.

The first doped semiconductor layer 105 may contain at least one of n-type impurities and p-type impurities. The first doped semiconductor layer 105 may be used as the common source structure CSL, described above with reference to FIG. 2B. In this case, the first doped semiconductor layer 105 may include an n-type doped silicon layer. The protective layer 107 may include an oxide layer. The sacrificial layer 109 may include an undoped silicon layer.

After the semiconductor structure 110 has been formed, insulating patterns 113A, 113B, and 113C penetrating the semiconductor structure 110 may be formed. The insulating patterns 113A, 113B, and 113C may includes a first insulating pattern 113A and a second insulating pattern 113B arranged in the capacitor area CAP, and a third insulating pattern 113C disposed in the contact area CTA. The first insulating pattern 113A and the second insulating pattern 113B may overlap the lower conductive pattern 101A, and the third insulating pattern 113C may overlap the second interconnection pattern 101C.

Next, interlayer insulating layers 121 and sacrificial insulating layers 123 may be alternatively stacked in the first direction on the semiconductor structure 110 penetrated by the first to third insulating patterns 113A to 113C. Thereafter, the step of forming a channel hole 131, which penetrates the interlayer insulating layers 121 and the sacrificial insulating layers 123 in the cell array area CEA and extends to the inside of the semiconductor structure 110, the step of forming a memory layer 133 on the surface of the channel hole 131, and the step of forming a channel structure 140, which fills the channel hole 131, on the memory layer 133 may be sequentially performed. In this way, the preliminary stack structure 120, which encloses the channel structure 140 and includes the interlayer insulating layers 121 and the sacrificial insulating layers 123 that are alternately stacked, may be formed.

The sacrificial insulating layers 123 may be formed of a material having an etch rate different from that of the interlayer insulating layers 121. For example, the interlayer insulating layers 121 may include an oxide layer, such as a silicon oxide, and the sacrificial insulating layers 123 may include a nitride layer, such as a silicon nitride.

The memory layer 133 may be formed of the same material as the memory layer ML, described above with reference to FIG. 4B. The channel structure 140 may include a semiconductor layer that may be used as a channel area of a memory string. In an embodiment, the channel structure 140 may include a first semiconductor layer 135 formed on the memory layer 133, and a core insulating layer 137 and a second semiconductor layer 139 formed on the first semiconductor layer 135 so as to fill the central region of the channel hole 131. The second semiconductor layer 139 may include n-type doped silicon.

Figure 8A:
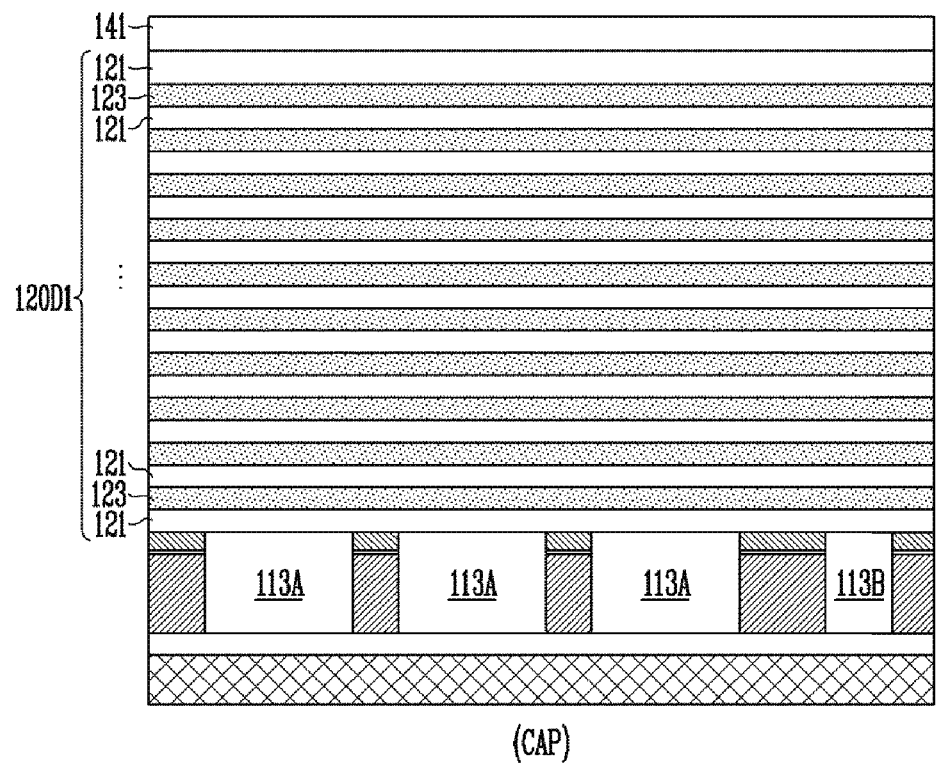
Figure 8B:
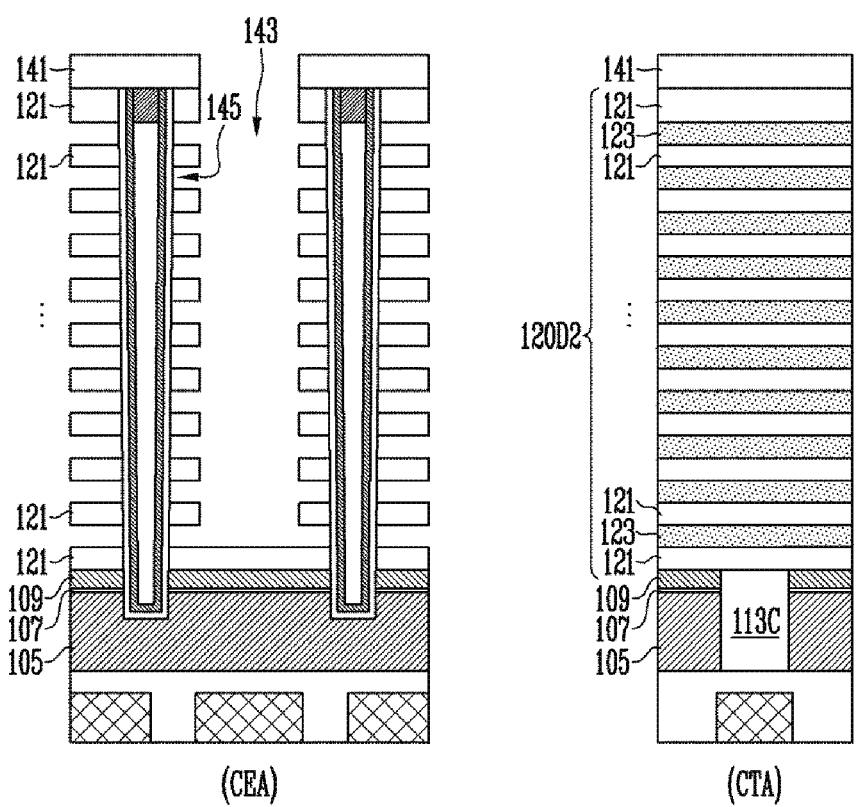
Figure 9:
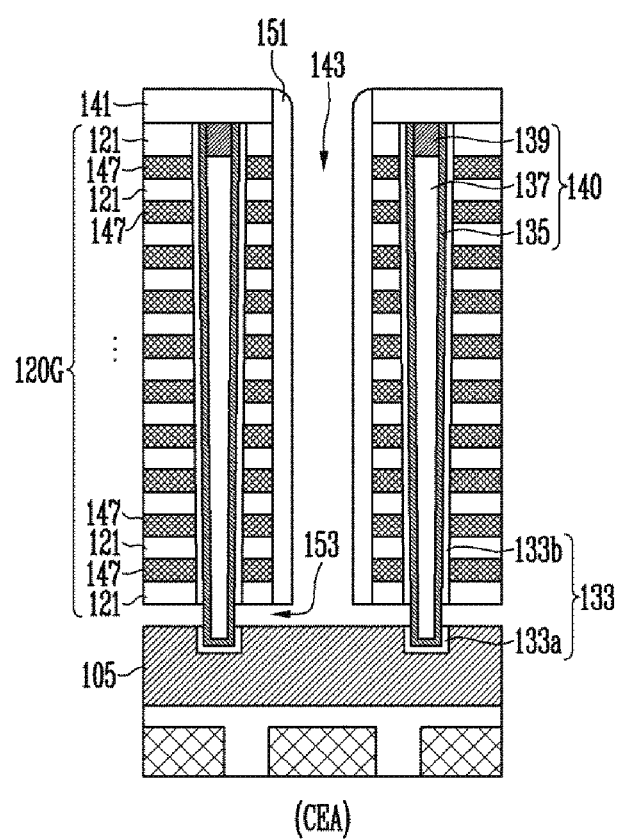

FIGS. 8A and 8B and FIG. 9 are sectional views illustrating the step of replacing some of the sacrificial insulating layers 123, arranged in the cell array area CEA, with conductive patterns 147. Before some of the sacrificial insulating layers 123 are replaced with the conductive patterns 147, a first upper insulating layer 141 may be formed on the preliminary stack structure 120.

The step of replacing the sacrificial insulating layers 123 with the conductive patterns 147 may include the step of opening first horizontal spaces 145 between the interlayer insulating layers 121 of the cell array area CEA, as illustrated in FIGS. 8A and 8B, and the step of filling the first horizontal spaces 145 with conductive patterns 147, as illustrated in FIG. 9.

Referring to FIGS. 8A and 8B, the step of opening the first horizontal spaces 145 may include the step of forming a slit 143 penetrating the preliminary stack structure 120 in the cell array area CEA, and the step of eliminating portions of respective sacrificial insulating layers 123 in the cell array area CEA through the slit 143. During an etching process of forming the slit 143, the sacrificial layer 109 may function as an etch stop layer.

The sacrificial insulating layers 123 may remain in the capacitor area CAP and the contact area CTA so as to form a first dummy stack structure 120D1 and a second dummy stack structure 120D2. Although not illustrated in the drawings, a barrier structure for protecting the sacrificial insulating layers 123 of the contact area CTA may be formed before the first horizontal spaces 145 are formed. The barrier structure may be an insulating layer that fills the first slit S1 illustrated in FIG. 3A.

Referring to FIG. 9, the step of forming the conductive patterns 147 may include the step of filling each of the first horizontal spaces 145, illustrated in FIG. 8B, with a conducive material, and the step of removing the conductive material within the slit 143 so that the conductive material is separated into the conductive patterns 147. In this way, gate stack structures 120G including the interlayer insulating layers 121 and the conductive patterns 145, which are separated from each other by the slit 143 and are alternately stacked, may be formed.

In order to form a doped semiconductor pattern coupled to the channel structure 140, a second horizontal space 153 may be formed. Before the second horizontal space 153 is formed, a spacer insulating layer 151 may be formed on the sidewall of each of the gate stack structures 120G.

The step of forming the second horizontal space 153 may include the step of removing the sacrificial layer 109 of the cell array area CEA, illustrated in FIG. 8B, so that the memory layer 133 is exposed, and the step of removing an exposed portion of the memory layer 133 so that the channel structure 140 is exposed. While the exposed portion of the memory layer 133 is removed, the protective layer 107 of the cell array area CEA, illustrated in FIG. 8B, may be removed. When the sacrificial layer 109 and the protective layer 107 arranged in the contact area CTA of FIG. 8B are adjacent to the cell array area CEA, the second horizontal space 153 may extend to the contact area CTA.

The first doped semiconductor layer 105 and the first semiconductor layer 135 of the channel structure 40 may be exposed through the second horizontal space 153. The memory layer 133 may be separated into a first memory pattern 133a and a second memory pattern 133b by the second horizontal space 153.

Figure 10A:
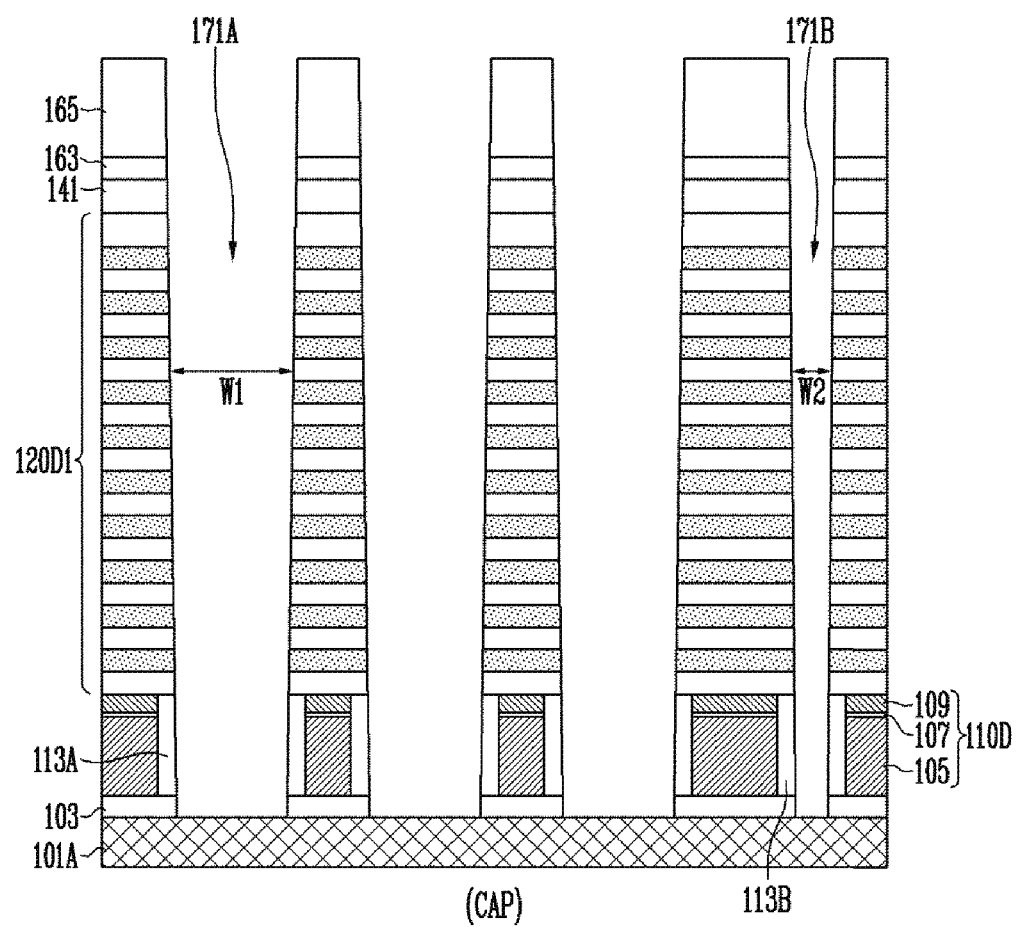
Figure 10B:
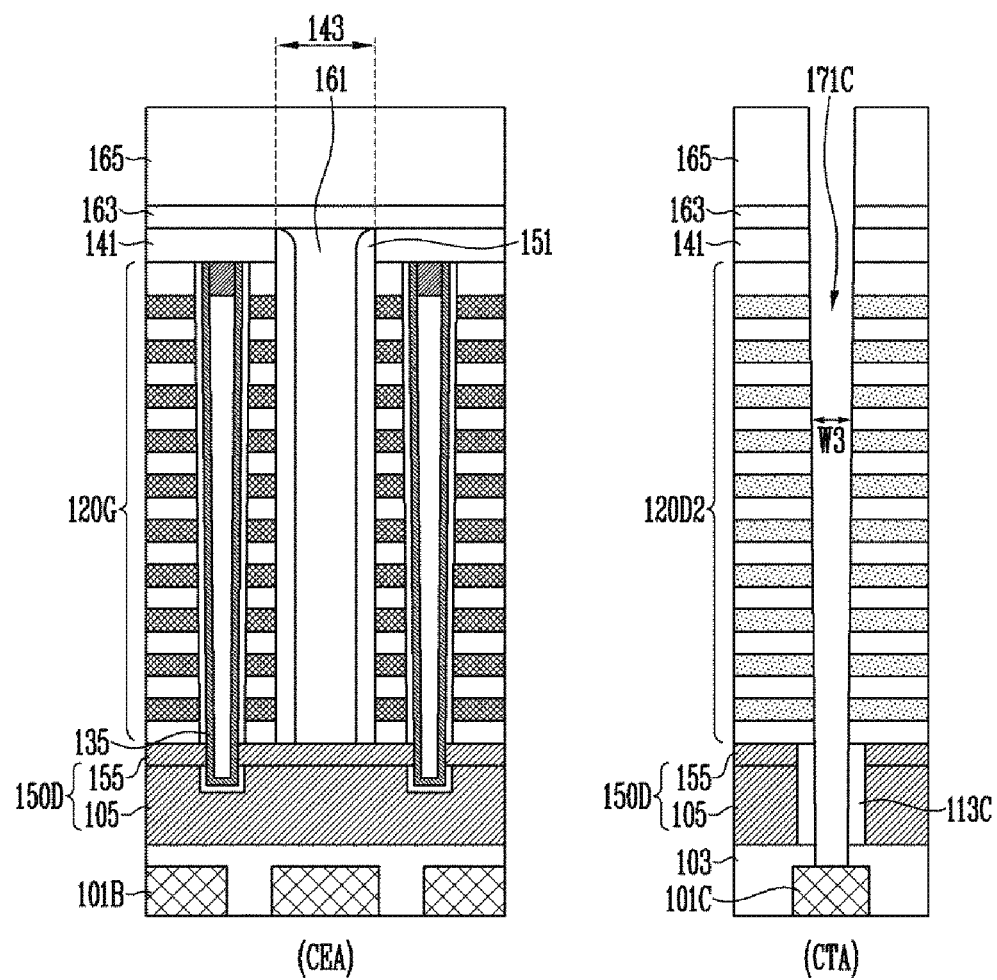

FIGS. 10A and 10B are sectional views illustrating the step of forming a doped semiconductor pattern 150D and the step of forming first to third openings 171A to 171C.

Referring to FIGS. 10A and 10B, the step of forming the doped semiconductor pattern 150D may include the step of filling the second horizontal space 153 of FIG. 9 with a second doped semiconductor layer 155. The second doped semiconductor layer 155 may be formed to be in contact with the first semiconductor layer 135 and the first doped semiconductor layer 105. In an embodiment, the second semiconductor layer 155 may include an n-type doped silicon layer.

The doped semiconductor pattern 150D may extend to the contact area CTA adjacent to the cell array area CEA. The first doped semiconductor layer 105, the protective layer 107, and the sacrificial layer 109, which are arranged in the capacitor area CAP, may remain as a dummy semiconductor pattern 110D.

Then, the slit 143 may be filled with at least one of an insulating material and a conductive material. In an embodiment, the slit 143 may be filled with an insulating layer 161.

Thereafter, a second upper insulating layer 163 may be formed on the first upper insulating layer 141. The second upper insulating layer 163 may extend to overlap the first dummy stack structure 120D1, the gate stack structures 120G, the insulating layer 161, and the second dummy stack structure 120D2.

After the second upper insulating layer 163 has been formed, first to third openings 171A to 171C may be formed. The step of forming the first to third openings 171A to 171C may include the step of forming a first mask pattern 165 on the second upper insulating layer 163, the step of etching the first dummy stack structure 120D1, the second dummy stack structure 120D2, first to third insulating patterns 113A to 113C, and the lower insulating layer 103 using the first mask pattern 165 as an etching barrier. The first mask pattern 165 may be a photoresist pattern formed using a photolithography process.

The first opening 171A may penetrate the second upper insulating layer 163, the first upper insulating layer 141, the first dummy stack structure 120D1, the first insulating pattern 113A, and the lower insulating layer 103, and may expose the lower conductive pattern 101A. The first opening 171A may correspond to any one of first penetration areas He and HeA to HeC illustrated in FIGS. 3A, 4A, and 6A to 6C.

The second opening 171B may penetrate the second upper insulating layer 163, the first upper insulating layer 141, the first dummy stack structure 120D1, the second insulating pattern 113B, and the lower insulating layer 103, and may expose the lower conductive pattern 101A. The second opening 171B may correspond to any one of first penetration areas Hv, and HvA to HvC illustrated in FIGS. 3A, 4A, and 6A to 6C.

The third opening 171C may penetrate the second upper insulating layer 163, the first upper insulating layer 141, the second dummy stack structure 120D2, the third insulating pattern 113C, and the lower insulating layer 103, and may expose the second interconnection pattern 101C. The third opening 171C may correspond to the contact hole Hp, illustrated in FIGS. 3A and 4C.

The first width W1 of the first opening 171A may be formed wider than the second width W2 of the second opening and the third width W3 of the third opening. In an embodiment, at the same level, the first width W1 may be more than twice the second width W2 or more than twice the third width W3.

Figure 11A:
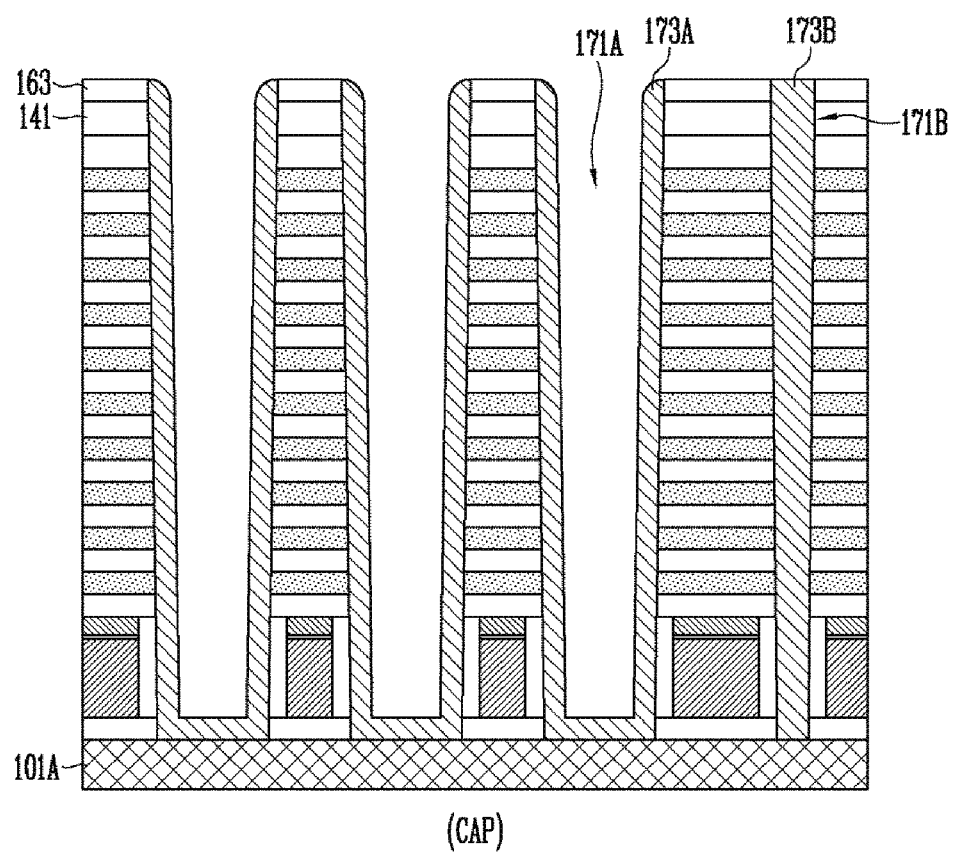
Figure 11B:
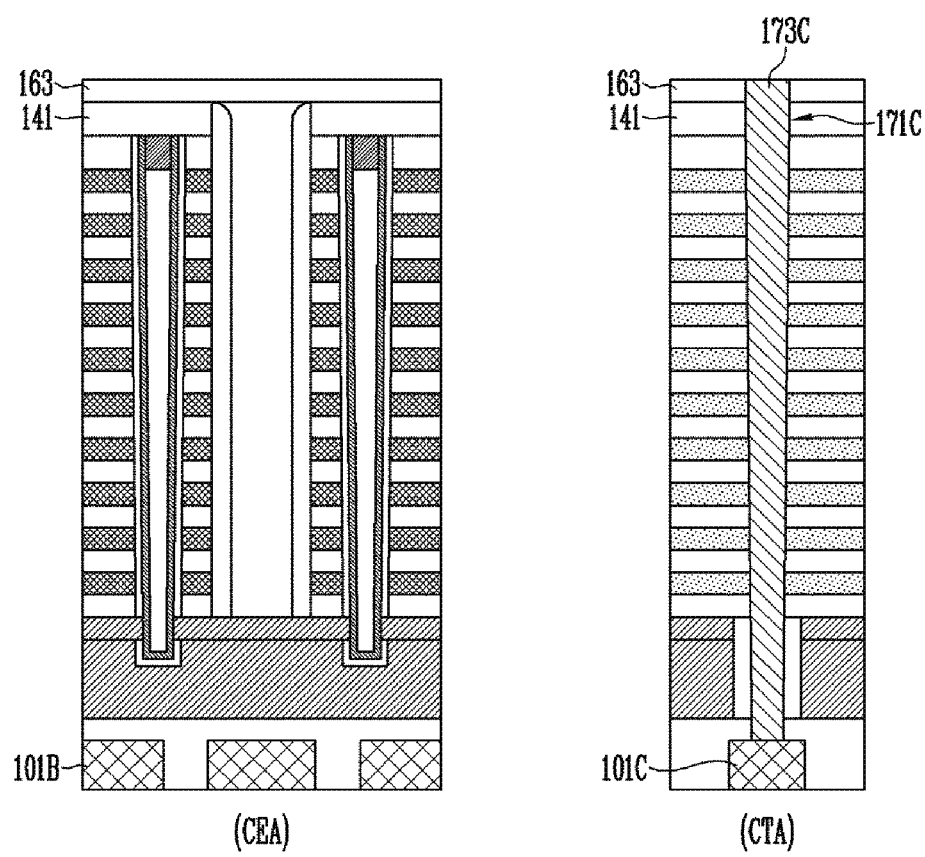

FIGS. 11A and 11B are sectional views illustrating the step of forming a first capacitor electrode 173A, a vertical contact plug 173B, and a peripheral contact plug 173C.

Referring to FIGS. 11A and 11B, before the first capacitor electrode 173A, the vertical contact plug 173B, and the peripheral contact plug 173C are formed, the first mask pattern 165, illustrated in FIGS. 10A and 10B, may be removed.

The step of forming the first capacitor electrode 173A, the vertical contact plug 173B, and the peripheral contact plug 173C may include the step of forming a conductive material in the first to third openings 171A to 171C so that the second opening 171B and the third opening 171C are filled with the conductive material, and the step of separating the conductive material into the first capacitor electrode 173A, the vertical contact plug 173B, and the peripheral contact plug 173C.

The conductive material may contain a barrier layer and a metal layer formed on the barrier layer. The barrier layer may be formed on the surface of each of the first to third openings 171A to 171C. The metal layer may be formed along the surface of the first opening 171A, and may be formed to fill the second opening 171B and the third opening 171C. The first opening 171A has a width wider than those of the second opening 171B and the third opening 171C. Accordingly, even if deposition thickness of the metal layer is controlled so that the central region of the first opening 171A is opened, respective central regions of the second opening 171B and the third opening 171C may be filled with the metal layer.

The step of separating the conductive material into the first capacitor electrode 173A, the vertical contact plug 173B, and the peripheral contact plug 173C may be performed using a planarization process, such as Chemical Mechanical Polishing (CMP). The first capacitor electrode 173A may remain on the surface of the first opening 171A, and the central region of the first opening 171A may be opened without being filled with the first capacitor electrode 173A. The second opening 171B may be filled with the vertical contact plug 173B, and the third opening 171C may be filled with the peripheral contact plug 173C.

The first capacitor electrode 173A and the vertical contact plug 173B may be coupled to the lower conductive pattern 101A. The peripheral contact plug 173C may be coupled to the second interconnection pattern 101C.

Figure 12A:
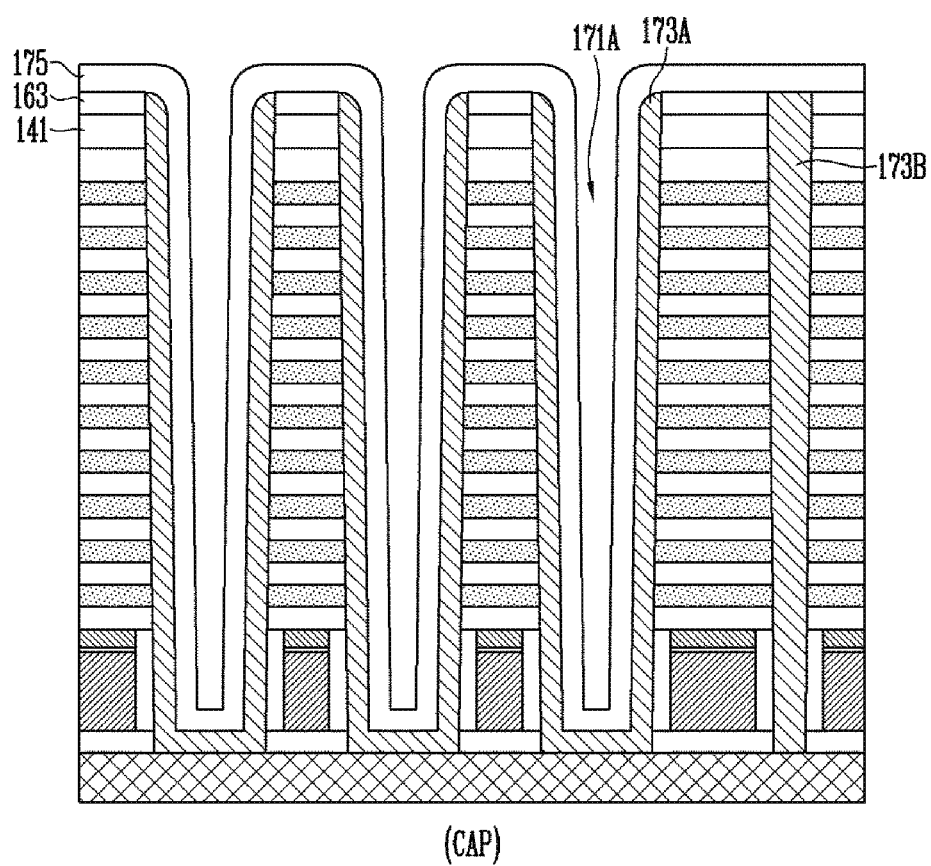
Figure 12B:
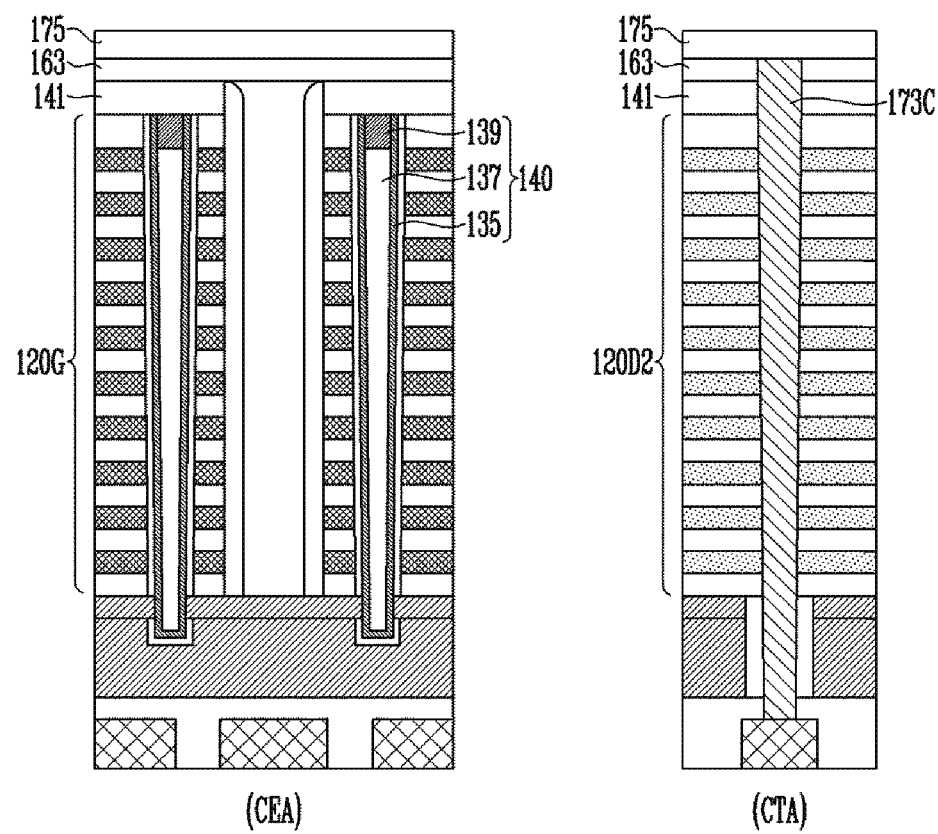

FIGS. 12A and 12B are sectional views illustrating the step of forming a dielectric layer 175.

Referring to FIGS. 12A and 12B, the dielectric layer 175 may be formed on the surface of the first capacitor electrode 173A, and may extend to cover the second upper insulating layer 163, the vertical contact plug 173B, and the peripheral contact plug 173C. The dielectric layer 175 may be formed of various insulating materials, such as an oxide layer. The deposition thickness of the dielectric layer 175 may be controlled such that the central region of the first opening 171A is opened.

Figure 13A:
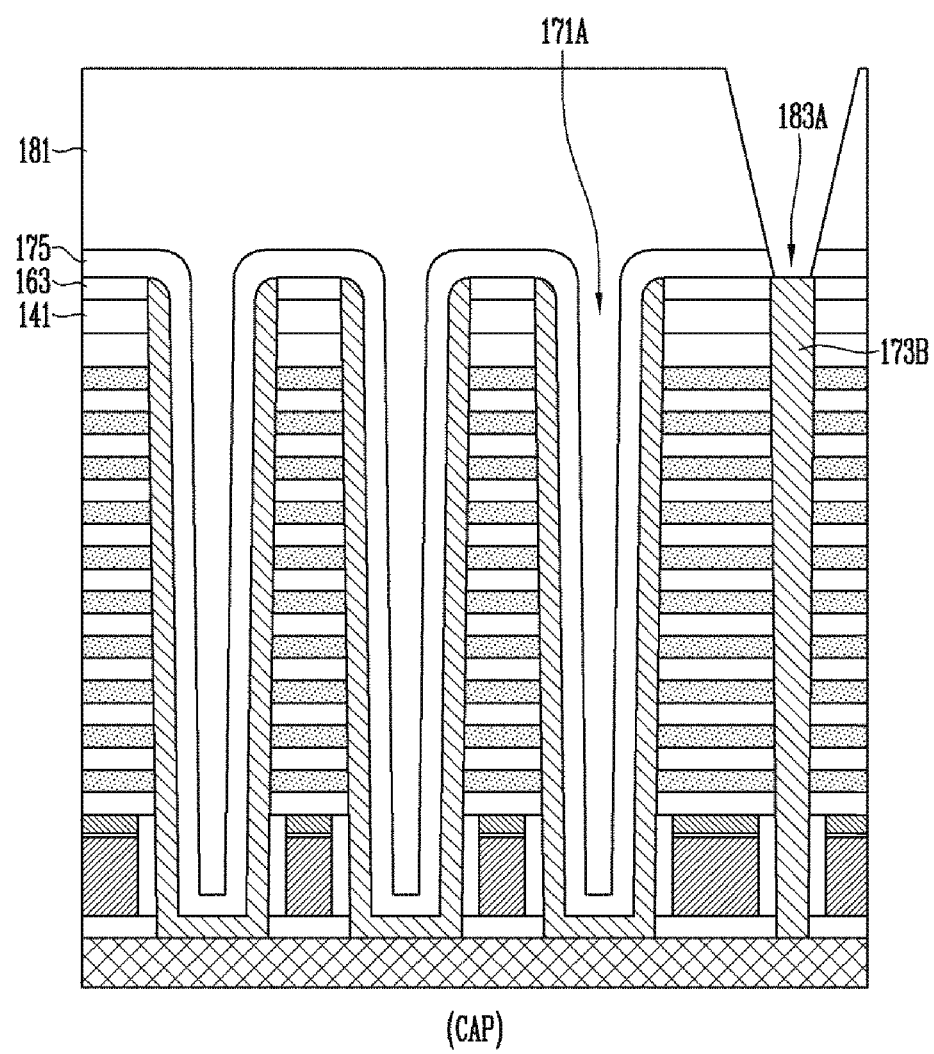
Figure 13B:
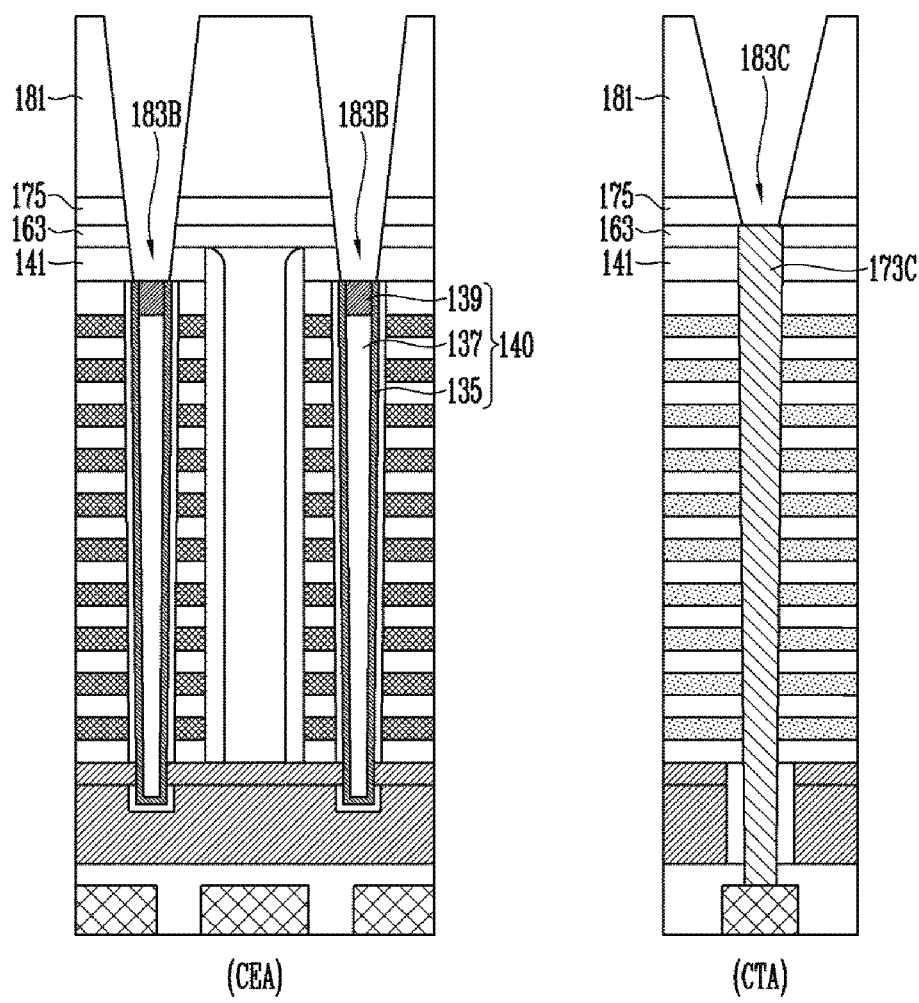

FIGS. 13A and 13B are sectional views illustrating the step of forming first to third contact holes 183A to 183C.

Referring to FIGS. 13A and 13B, the step of forming the first to third contact holes 183A to 183C may include the step of forming a second mask pattern 181 on the dielectric layer 175 and the step of etching the dielectric layer 175, the second upper insulating layer 163, and the first upper insulating layer 141 using the second mask pattern 181 as an etching barrier. The second mask pattern 181 may be a photoresist pattern formed using a photolithography process. The second mask pattern 181 may fill the central region of the first opening 171A on the dielectric layer 175.

The first contact hole 183A may penetrate the dielectric layer 175 overlapping the vertical contact plug 173B, and may expose the vertical contact plug 173B. The second contact hole 183B may penetrate the dielectric layer 175, the second upper insulating layer 163, and the first upper insulating layer 141 which overlap the channel structure 140, and may expose a second semiconductor layer 139 of the channel structure 150. The third contact hole 183C may penetrate the dielectric layer 175 overlapping the peripheral contact plug 173C, and may expose the peripheral contact plug 173C.

Figure 14A:
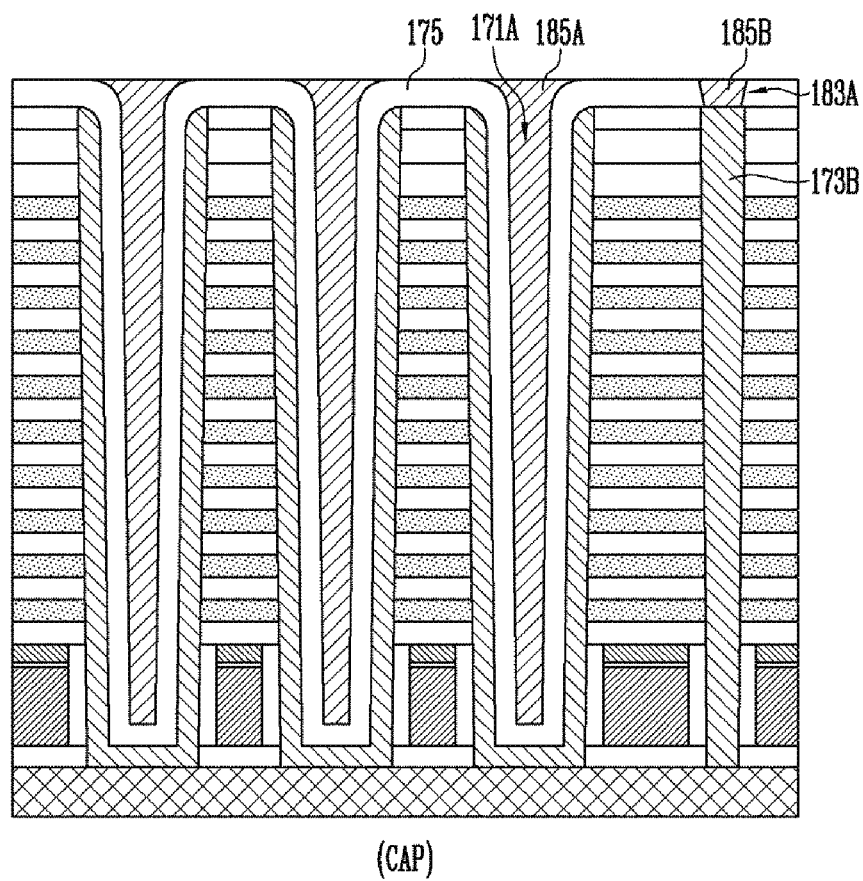
Figure 14B:
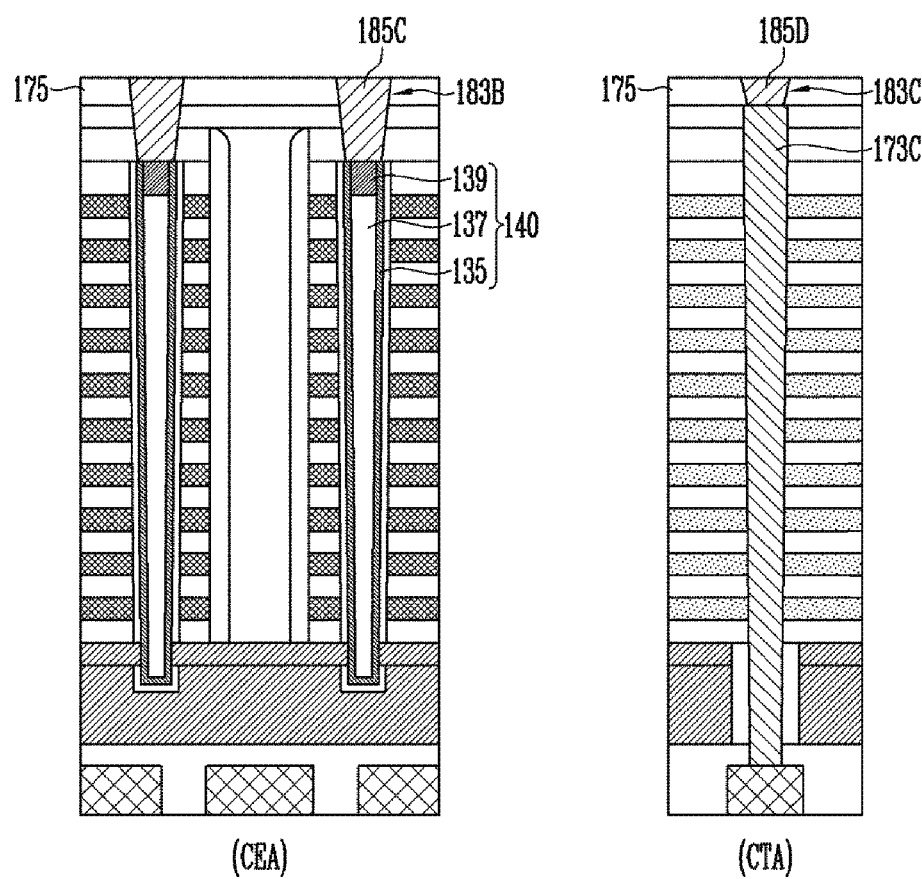

FIGS. 14A and 14B are sectional views illustrating the step of forming a second capacitor electrode 185A, a lower plug 185B, a first drain contact plug 185C, and a first contact plug 185D.

Referring to FIGS. 14A and 14B, the step of forming the second capacitor electrode 185A, the lower plug 185B, the first drain contact plug 185C, and the first contact plug 185D may include the step of removing the second mask pattern 181 of FIGS. 13A and 13B, the step of forming a conductive material so that the first opening 171A and the first to third contact holes 183A to 183C are filled with the conductive material, and the step of separating the conductive material into the second capacitor electrode 185A, the lower plug 185B, the first drain contact plug 185C, and the first contact plug 185D.

As the second mask pattern 181 illustrated in FIGS. 13A and 13B is removed, the central region of the first opening 171A may be exposed.

The conductive material may contain a barrier layer and a metal layer formed on the barrier layer. The barrier layer may be formed on the surface of each of the first opening 171A and the first to third contact holes 183A to 183C. The metal layer may be formed to fill the first opening 171A and the first to third contact holes 183A to 183C.

The step of separating the conductive material into the second capacitor electrode 185A, the lower plug 185B, the first drain contact plug 185C, and the first contact plug 185D may be performed using a planarization process, such as CMP. The second capacitor electrode 185A may fill the central region of the first opening 171A on the dielectric layer 175. The lower plug 185B may fill the first contact hole 183A, and may be coupled to the vertical contact plug 173B. The first drain contact plug 185C may fill the second contact hole 183B, and may be coupled to the second semiconductor layer 139 of the channel structure 140. The first contact plug 185D may fill the third contact hole 183C, and may be coupled to the peripheral contact plug 173C.

Figure 15A:
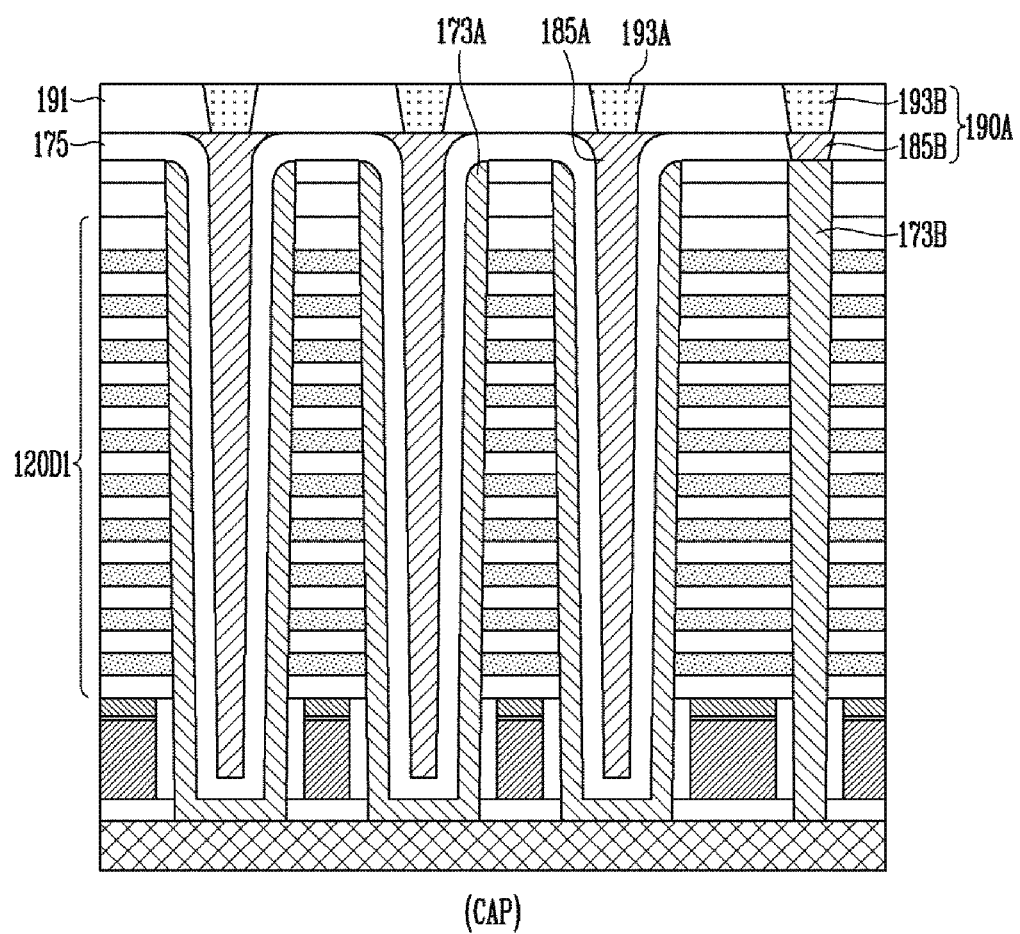
Figure 15B:
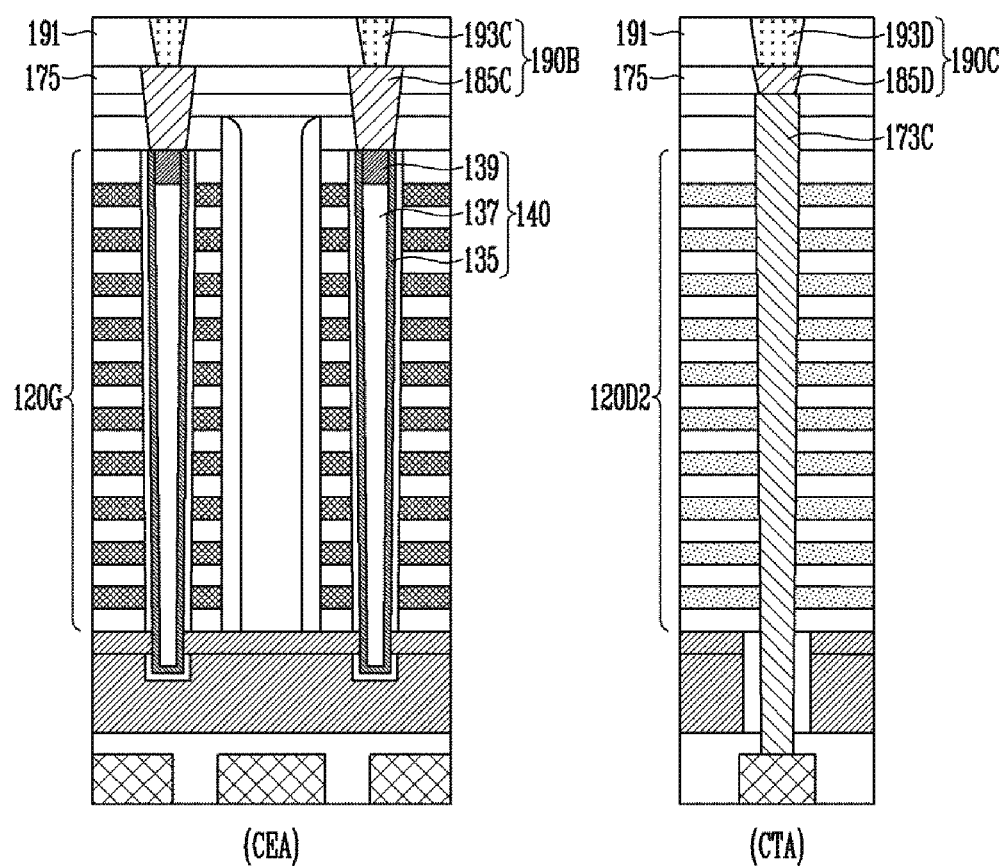

FIGS. 15A and 15B are sectional views illustrating the step of forming an upper plug 193B of a first capacitor contact structure 190A, a second capacitor contact structure 193A, a second drain contact plug 193C, and a second contact plug 193D.

Referring to FIGS. 15A and 15B, the upper plug 193B, the second capacitor contact structure 193A, the second drain contact plug 193C, and the second contact plug 193D may penetrate a third upper insulating layer 191. The third upper insulating layer 191 may be formed on the dielectric layer 175 to overlap the first dummy stack structure 120D1, the gate stack structures 120G, and the second dummy stack structure 120D2.

The upper plug 193B may penetrate the third upper insulating layer 191 overlapping the lower plug 185B, and may be coupled to the lower plug 185B. The upper plug 193B and the lower plug 185B may form the first capacitor contact structure 190A coupled to the vertical contact plug 173B. The second capacitor contact structure 193A may penetrate the third upper insulating layer 191 overlapping the second capacitor electrode 185A, and may be coupled to the second capacitor electrode 185A. The second drain contact plug 193C may penetrate the third upper insulating layer 191 overlapping the first drain contact plug 185C, and may be coupled to the first drain contact plug 185C. The second drain contact plug 193C and the first drain contact plug 185C may form a bit line contact structure 190B coupled to the channel structure 140. The second contact plug 193D may penetrate the third upper insulating layer 191 overlapping the first contact plug 185D, and may be coupled to the first contact plug 185D. The second contact plug 193D and the first contact plug 185D may form an upper contact structure 190C coupled to the peripheral contact plug 173C.

Figure 16A:
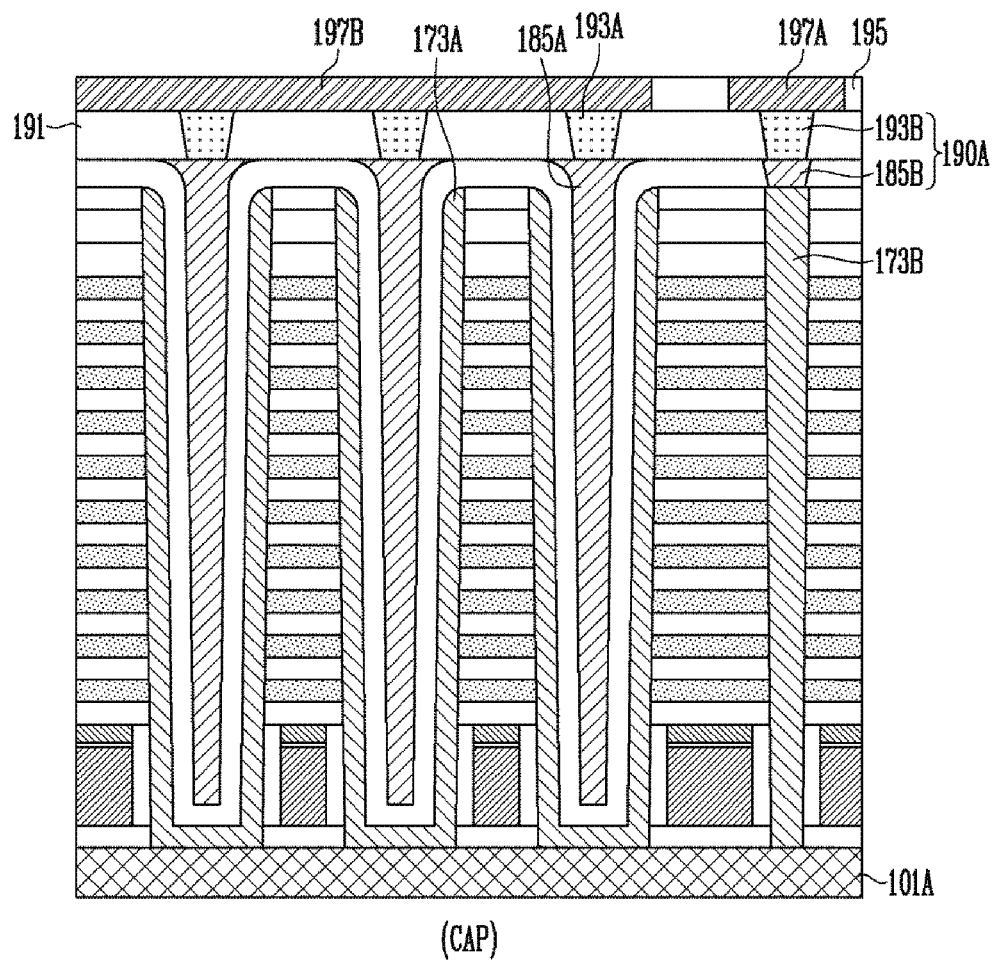
Figure 16B:
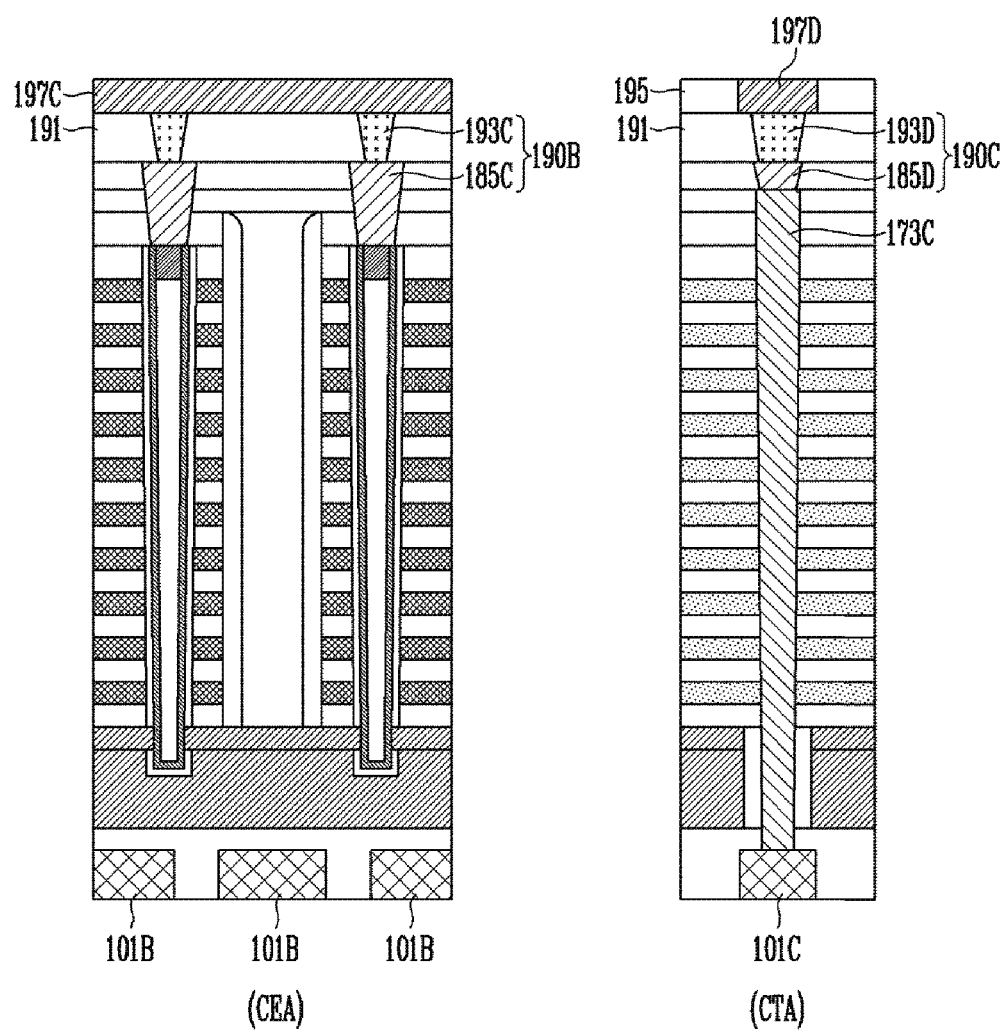

FIGS. 16A and 16B are sectional views illustrating the step of forming a first upper conductive pattern 197A, a second upper conductive pattern 197B, a bit line 197C, and a third upper conductive pattern 197D.

Referring to FIGS. 16A and 16B, the first upper conductive pattern 197A, the second upper conductive pattern 197B, the bit line 197C, and the third upper conductive pattern 197D may penetrate the fourth upper insulating layer 195. The fourth upper insulating layer 195 may be formed on the third upper insulating layer 191 to cover the first capacitor contact structure 190A, the second capacitor contact structure 193A, the bit line contact structure 190B, and the upper contact structure 190C.

The first upper conductive pattern 197A may penetrate the fourth upper insulating layer 195 overlapping the first capacitor contact structure 190A, and may be coupled to the upper plug 193B of the first capacitor contact structure 190A. The second upper conductive pattern 197B may penetrate the fourth upper insulating layer 195 overlapping the second capacitor contact structure 193A, and may be coupled to the second capacitor contact structure 193A. The bit line 197C may penetrate the fourth upper insulating layer 195 overlapping the bit line contact structure 190B, and may be coupled to the second drain contact plug 193C of the bit line contact structure 190B. The third upper conductive pattern 197D may penetrate the fourth upper insulating layer 195 overlapping the upper contact structure 190C, and may be coupled to the second contact plug 193D of the upper contact structure 190C.

In accordance with an embodiment of the present disclosure, while the first capacitor electrode 173A coupled to the lower conductive pattern 101A is formed, the vertical contact plug 173B may be formed, and the peripheral contact plug 173C coupled to the peripheral circuit may be formed.

Also, in accordance with an embodiment of the present disclosure, while the second capacitor electrode 185A is formed, the lower plug 185B of the first capacitor contact structure 190A, the first drain contact plug 185C of the bit line contact structure 190B, and the first contact plug 185D of the upper contact structure 190C may be formed.

Figure 17:
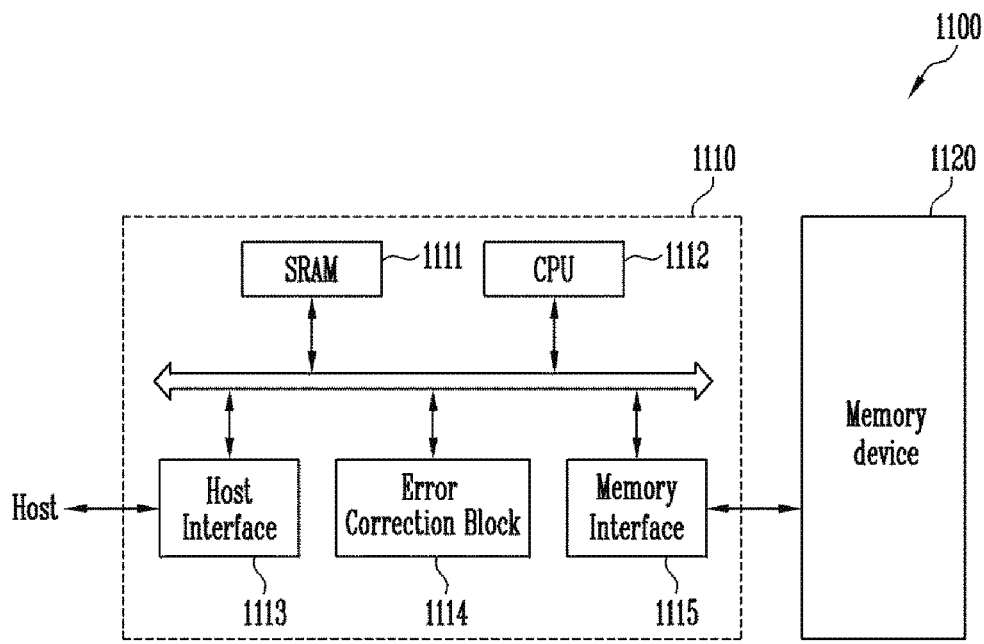
FIG. 17 is a block diagram illustrating the configuration of a memory system according to an embodiment of the present disclosure.

FIG. 17 is a block diagram illustrating the configuration of a memory system 1100 according to an embodiment of the present disclosure.

Referring to FIG. 17, the memory system 1100 according to an embodiment of the present disclosure includes a memory element 1120 and a memory controller 1110.

The memory device 1120 may be a multi-chip package including a plurality of flash memory chips. The memory device 1120 may include at least one of the capacitors, described above with reference to FIGS. 3A, 4A, and 6A to 6C.

The memory controller 1110 may control the memory device 1120, and may include a static random access memory (SRAM) 1111, a central processing unit (CPU) 1112, a host interface 1113, an error correction block 1114, and a memory interface 1115. The SRAM 1111 is used as a working memory of the CPU 1112, the CPU 1112 performs general control operations for data exchange of the memory controller 1110, and the host interface 1113 is provided with a data interchange protocol of a host coupled to the memory system 1100. Furthermore, the error correction block 1114 detects and corrects an error included in the data that is read from the memory device 1120, and the memory interface 1115 interfaces with the memory device 1120. In addition, the memory controller 1110 may further include a read only memory (ROM) or the like that stores code data for interfacing with the host.

The above-described memory system 1100 may be a memory card or a solid state drive (SSD) equipped with the memory device 1120 and the memory controller 1110. For example, when the memory system 1100 is an SSD, the memory controller 1110 may communicate with an external device (e.g., host) via one of various interface protocols, such as a universal serial bus (USB), a multimedia card (MMC), a peripheral component interconnection-express (PCI-E), a serial advanced technology attachment (SATA), a parallel advanced technology attachment (PATA), a small computer system interface (SCSI), an enhanced small disk interface (ESDI), or an Integrated Drive Electronics (IDE).

Figure 18:
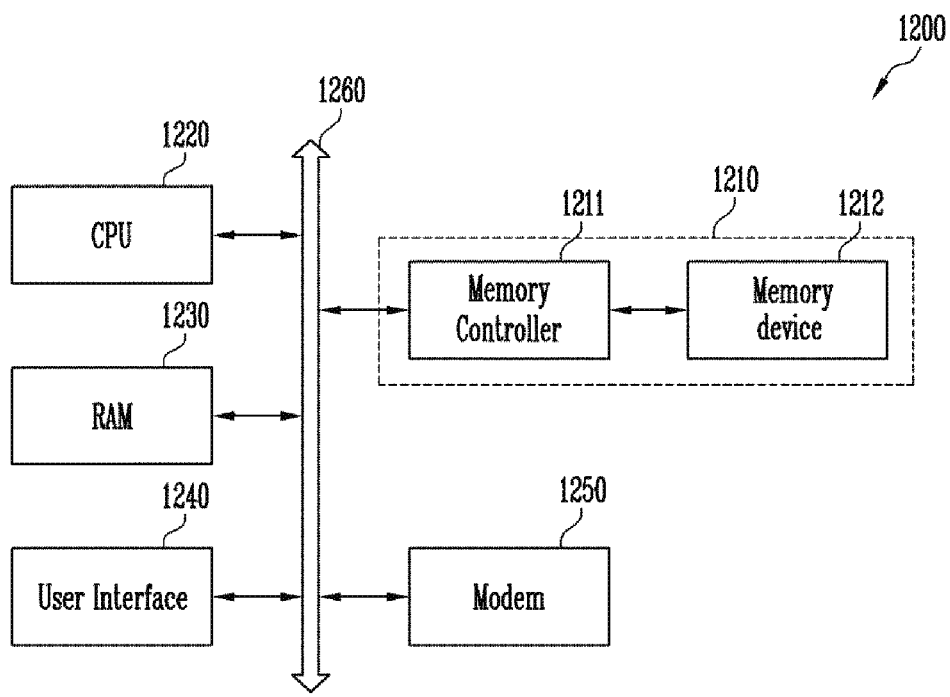
FIG. 18 is a block diagram illustrating the configuration of a computing system according to an embodiment of the present disclosure.

FIG. 18 is a block diagram illustrating the configuration of a computing system 1200 according to an embodiment of the present disclosure.

Referring to FIG. 18, the computing system 1200 according to an embodiment of the present disclosure may include a CPU 1220, a random access memory (RAM) 1230, a user interface 1240, a modem 1250, and a memory system 1210 that are electrically coupled to a system bus 1260. Also, when the computing system 1200 is a mobile device, it may further include a battery for supplying an operation voltage to the computing system 1200, and may further include an application chip set, an image processor, a mobile DRAM, etc.

The memory system 1210 may include a memory device 1212 and a memory controller 1211. The memory device 1212 may be a multi-chip package including a plurality of flash memory chips. The memory device 1212 may include at least one of the capacitors, described above with reference to FIGS. 3A, 4A, and 6A to 6C.

Embodiments of the present disclosure may form a capacitor including a first capacitor electrode and a second capacitor electrode in a vertical structure, thus increasing the capacity of the capacitor in a limited area.

What is claimed is:
1. A semiconductor memory device, comprising:
a gate stack structure including interlayer insulating layers and conductive patterns stacked in a first direction;
a channel structure penetrating the gate stack structure;
a first dummy stack structure spaced apart from the gate stack structure on a plane intersecting the channel structure;
a capacitor penetrating the first dummy stack structure;
a second dummy stack structure spaced apart from the gate stack structure and the first dummy stack structure on the plane; and
a peripheral contact plug penetrating the second dummy stack structure,
wherein the capacitor comprises:
a first capacitor electrode including a groove;
a dielectric layer on a surface of the groove; and
a second capacitor electrode on the dielectric layer and filling the groove, and
wherein a cross-sectional area of the capacitor occupied by the first capacitor electrode, the dielectric layer and the second capacitor electrode is wider than a cross-sectional area of the peripheral contact plug at a same level.

2. The semiconductor memory device according to claim 1, wherein the first capacitor electrode includes a horizontal component parallel with the plane and a vertical component extending from the horizontal component in the first direction.

3. The semiconductor memory device according to claim 2, wherein the vertical component is narrower than the peripheral contact plug.

4. The semiconductor memory device according to claim 1, further comprising:
a lower insulating layer disposed below the gate stack structure and extending to overlap the peripheral contact plug and the capacitor; and
a lower conductive pattern embedded in the lower insulating layer,
wherein the first capacitor electrode extends to contact the lower conductive pattern.

5. The semiconductor memory device according to claim 4, wherein each of the first capacitor electrode and the dielectric layer extends to a region between the second capacitor electrode and the lower conductive pattern.

6. The semiconductor memory device according to claim 4, further comprising:
a vertical contact plug extending from the lower conductive pattern in the first direction and spaced apart from the capacitor on the plane;
a first capacitor contact structure extending from the vertical contact plug in the first direction; and
a first upper conductive pattern disposed on the first capacitor contact structure.

7. The semiconductor memory device according to claim 6, wherein the vertical contact plug has an area narrower than an area of the capacitor.

8. The semiconductor memory device according to claim 6, further comprising:
a second capacitor contact structure extending from the second capacitor electrode in the first direction; and
a second upper conductive pattern disposed on the second capacitor contact structure and facing the first upper conductive pattern.

9. The semiconductor memory device according to claim 1,
wherein the first dummy stack structure includes first dummy interlayer insulating layers and first sacrificial insulating layers alternately stacked in the first direction,
wherein the second dummy stack structure includes second dummy interlayer insulating layers and second sacrificial insulating layers alternately stacked in the first direction,
wherein the first dummy interlayer insulating layers and the first sacrificial insulating layers are penetrated by a penetration area filled with the capacitor,
wherein the second dummy interlayer insulating layers and the second sacrificial insulating layers are penetrated by a contact hole filled with the peripheral contact plug, and
wherein the penetration area has an area wider than an area of the contact hole.

10. A semiconductor memory device comprising:
a gate stack structure including interlayer insulating layers and conductive patterns stacked in a first direction;
a channel structure penetrating the gate stack structure;
a peripheral contact plug spaced apart from the gate stack structure on a plane intersecting the channel structure, the peripheral contact plug extending in the first direction; and
a capacitor spaced apart from the gate stack structure and the peripheral contact plug on the plane,
wherein the capacitor comprises:
a first capacitor electrode including a groove;
a dielectric layer on a surface of the groove; and
a second capacitor electrode on the dielectric layer and filling the groove;
a vertical contact plug spaced apart from the capacitor on the plane and parallel with the second capacitor electrode;
a first insulating pattern enclosing a lower portion of the first capacitor electrode;
a second insulating pattern enclosing a lower portion of the vertical contact plug;
a third insulating pattern enclosing a lower portion of the peripheral contact plug;
a doped semiconductor pattern enclosing a lower portion of the channel structure; and
a dummy semiconductor pattern penetrated by the first and second insulating patterns.

11. The semiconductor memory device according to claim 10, further comprising:
a lower insulating layer disposed below the doped semiconductor pattern and extending to overlap the first, second, and third insulating patterns and the dummy semiconductor pattern;
a lower conductive pattern embedded in the lower insulating layer and configured to extend to overlap the first capacitor electrode and the vertical contact plug; and
an interconnection pattern embedded in the lower insulating layer and coupled to a peripheral circuit,
wherein the first capacitor electrode and the vertical contact plug penetrate the lower insulating layer so as to be in contact with the lower conductive pattern, and
wherein the peripheral contact plug penetrates the lower insulating layer so as to be in contact with the interconnection pattern.

12. A semiconductor memory device, comprising:
a lower conductive pattern;
a vertical contact plug extending from the lower conductive pattern in a first direction;
a first upper conductive pattern coupled to the vertical contact plug;
a first capacitor coupled to the lower conductive pattern;
a second capacitor coupled to the lower conductive pattern; and
a second upper conductive pattern coupled to the first capacitor and the second capacitor,
wherein each of the first capacitor and the second capacitor comprises:
a first capacitor electrode including a horizontal component in contact with the lower conductive pattern and extending in parallel with the lower conductive pattern and a vertical component extending from the horizontal component in the first direction;
a dielectric layer formed on the first capacitor electrode; and
a second capacitor electrode formed on the dielectric layer and extending in parallel with the vertical component,
wherein the vertical contact plug and the horizontal component of the first capacitor electrode are connected to each other by the lower conductive pattern.

13. The semiconductor memory device according to claim 12, wherein a contact area between the lower conductive pattern and the horizontal component is wider than a contact area between the lower conductive pattern and the vertical contact plug.

14. The semiconductor memory device according to claim 12, wherein the vertical component is narrower than the vertical contact plug.

15. The semiconductor memory device according to claim 12, further comprising:
- a dummy stack structure overlapping the lower conductive pattern and including dummy interlayer insulating layers and sacrificial insulating layers alternately stacked in the first direction;
- a lower insulating layer interposed between the dummy stack structure and the lower conductive pattern;
- a dummy semiconductor pattern interposed between the lower insulating layer and the dummy stack structure; and
- first and second insulating patterns penetrating the dummy semiconductor pattern.

16. The semiconductor memory device according to claim 15, wherein:
- each of the first capacitor and the second capacitor penetrates the dummy stack structure, the first insulating pattern, and the lower insulating layer, and
- the vertical contact plug penetrates the dummy stack structure, the second insulating pattern, and the lower insulating layer.

17. The semiconductor memory device according to claim 15, wherein the dielectric layer extends to a region between the dummy stack structure and the first upper conductive pattern and a region between the dummy stack structure and the second upper conductive pattern.

* * * * *